United States Patent
Yokoyama et al.

(10) Patent No.: US 10,583,510 B2
(45) Date of Patent: Mar. 10, 2020

(54) HEATING AND COOLING DEVICE

(71) Applicant: FUJI ELECTRIC CO., LTD., Kawasaki-shi (JP)

(72) Inventors: Shoji Yokoyama, Hachioji (JP); Takeshi Matsushita, Matsumoto (JP); Hiroaki Nakahara, Hino (JP); Masaki Takeuchi, Saitama (JP); Takenori Wada, Ageo (JP); Masahiro Momose, Matsumoto (JP); Masahiro Kikuchi, Matsumoto (JP); Yoshio Igarashi, Azumino (JP); Mitsuhiro Naruse, Inagi (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 294 days.

(21) Appl. No.: 15/479,019

(22) Filed: Apr. 4, 2017

(65) Prior Publication Data
US 2017/0203377 A1 Jul. 20, 2017

Related U.S. Application Data

(63) Continuation of application No. PCT/JP2015/086244, filed on Dec. 25, 2015.

(30) Foreign Application Priority Data

Dec. 26, 2014 (JP) .................................. 2014-265376
Dec. 26, 2014 (JP) .................................. 2014-265389

(51) Int. Cl.
*B23K 1/00* (2006.01)
*H01L 21/67* (2006.01)
(Continued)

(52) U.S. Cl.
CPC .............. *B23K 1/002* (2013.01); *B23K 1/008* (2013.01); *B23K 3/0475* (2013.01); *B23K 3/085* (2013.01);
(Continued)

(58) Field of Classification Search
CPC ...... B23K 1/002; B23K 1/008; B23K 3/0475; B23K 3/085; B23K 2101/40;
(Continued)

(56) References Cited

U.S. PATENT DOCUMENTS 6,753,272 B1 * 6/2004 Lee ...................... C23C 16/481
118/688
8,271,124 B2 9/2012 Ol et al.
(Continued)

FOREIGN PATENT DOCUMENTS

JP 11-233934 8/1999
JP 2002-144076 5/2002
(Continued)

OTHER PUBLICATIONS

Machine Translation of Kamiya JP2007-242691 (Year: 2019).*

*Primary Examiner* — Brian W Jennison

(57) ABSTRACT

A heating and cooling device including: an airtight processing chamber openable to load a member-to-be-processed in the airtight processing chamber; a transfer apparatus to adjust a distance between the member-to-be-processed and a cooling unit that cools the member-to-be-processed, by moving the member-to-be-processed and/or the cooling unit; an induction heating apparatus to heat the member-to-be-processed, including a induction heating coil; a cooling apparatus to cool the member-to-be-processed by cooling the cooling unit; a temperature sensor to determine a temperature of the member-to-be-processed; and a controller to control the induction heating apparatus and the cooling
(Continued)

apparatus based on the temperature determined by the temperature sensor.

20 Claims, 11 Drawing Sheets

(51) Int. Cl.
| | |
|---|---|
| *B23K 1/002* | (2006.01) |
| *B23K 3/08* | (2006.01) |
| *B23K 1/008* | (2006.01) |
| *B23K 3/047* | (2006.01) |
| *H01L 23/00* | (2006.01) |
| *B23K 101/40* | (2006.01) |
| *H05K 3/34* | (2006.01) |

(52) U.S. Cl.
CPC .. *H01L 21/67103* (2013.01); *H01L 21/67109* (2013.01); *H01L 21/67115* (2013.01); *H01L 21/67144* (2013.01); *H01L 21/67248* (2013.01); *H01L 24/75* (2013.01); *B23K 2101/40* (2018.08); *H01L 2224/759* (2013.01); *H01L 2224/7565* (2013.01); *H01L 2224/75101* (2013.01); *H01L 2224/75265* (2013.01); *H01L 2224/75501* (2013.01); *H05K 3/3494* (2013.01)

(58) Field of Classification Search
CPC ......... H01L 21/67103; H01L 21/67109; H01L 21/67115; H01L 21/67144; H01L 21/67248; H01L 24/75; H01L 2224/75101; H01L 2224/75265; H01L 2224/75501; H01L 2224/7565; H01L 2224/759
See application file for complete search history.

(56) References Cited

U.S. PATENT DOCUMENTS

| | | | |
|---|---|---|---|
| 2007/0166134 A1* | 7/2007 | Suzuki | H01L 21/67109 414/217 |
| 2009/0184152 A1* | 7/2009 | Kimbara | B23K 1/0016 228/111 |
| 2009/0236328 A1 | 9/2009 | Dingle et al. | |
| 2010/0232470 A1* | 9/2010 | Timans | G01J 5/0003 374/2 |

FOREIGN PATENT DOCUMENTS

| | | |
|---|---|---|
| JP | 2007-242691 | 9/2007 |
| JP | 2008-182120 | 8/2008 |
| JP | 2009-119510 | 6/2009 |
| JP | 2009-170705 | 7/2009 |
| JP | 2009-226482 | 10/2009 |
| JP | 2010-161207 | 7/2010 |
| WO | WO2007/074835 A1 | 7/2007 |

\* cited by examiner

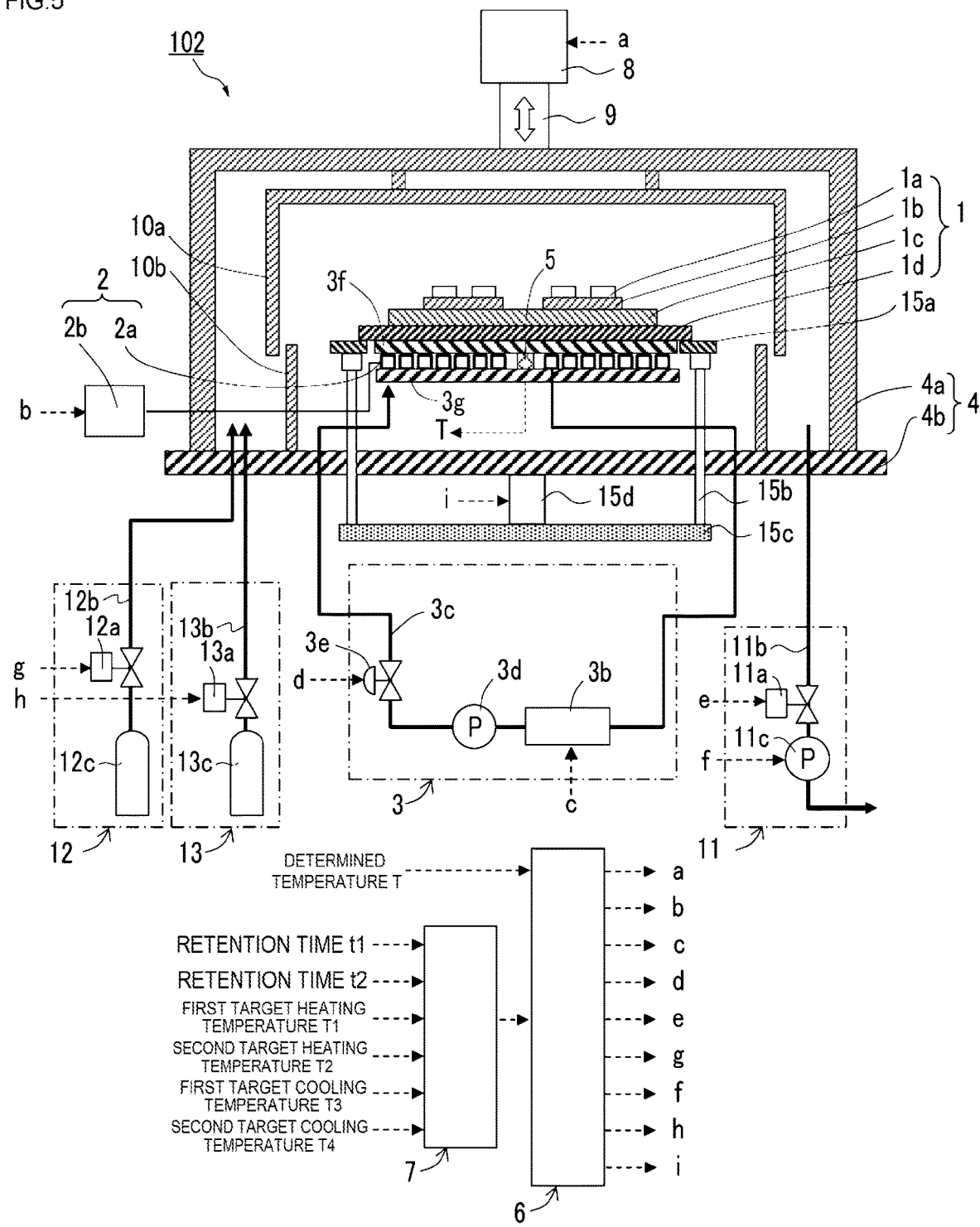

HEATING AND COOLING DEVICE

CROSS-REFERENCE TO RELATED APPLICATIONS

This application is a continuation application, filed under 35 U.S.C. § 111(a), of International Application PCT/JP2015/086244 filed on Dec. 25, 2015 and claims foreign priority to Japanese Patent Application No. 2014-265389, filed Dec. 26, 2014 and Japanese Patent Application No. 2014-265376, filed Dec. 26, 2014, the content of each of which is incorporated herein by reference in its entirety.

BACKGROUND

1. Field

The present disclosure relates to a heating and cooling device, particularly a heating and cooling device by which a semiconductor element is suitably soldered to a substrate.

2. Related Art

In a conventional soldering apparatus, it is known for a continuous-conveying-type reflow furnace to perform a reflow process, while putting a member for soldering on a conveyer, so as to pass through a preliminary heating zone, a full heating zone, and a cooling zone. Generally, the reflow furnace is configured to open to the atmosphere.

However, in recent years, a power semiconductor module and the like that are employed as, for example, a switching device applied for power conversion purpose are required to use under severe environmental condition. Then excellent strength and high heat resistance are required even in a solder joining face between an insulating substrate and a semiconductor chip such as an insulated gate bipolar transistor (IGBT) or an electronic component such as a freewheeling diode (FWD), or in another solder joining face between the insulating substrate and a base plate. Then instead of a solder material composed of a Sn—Ag based material that does not have a sufficient joining strength even though it has excellent solder wettability, there is an increasing tendency to adopt another solder material composed of a Sn—Sb based material with highly concentrated Sb in which excellent joining strength is readily achieved.

However, in comparison with the solder material composed of the Sn—Ag based material, the solder material composed of the Sn—Sb based material with highly concentrated Sb has poor properties in solder wettability as a thick oxide is formed on a surface of a member-to-be-soldered. When using the reflow furnace opening to the atmosphere, surface oxide is not fully reduced on a member-to-be-soldered. Then a problem is raised so that a void is easily generated on the solder joining face.

In Japanese Patent Application Laid-Open No. 2010-161207, JP-A No. 2008-182120, and JP-A No. 2009-170705 (hereinafter "Patent Literatures 1 to 3"), it is described for a way to prevent voids from occurring so that a reflow process is performed under reducing gas atmosphere to improve solder wettability.

Further, in JP-A No. 2002-144076 (hereinafter "Patent Literature 4"), another reflow furnace configured to perform a reflow process to a material-to-be-processed is disclosed so that an inner space of a vertical process tube capable of being sealed with airtightness is divided into a full heating zone, a preliminary heating zone, and a cooling zone, and then an elevator means carrying the material-to-be-processed is transferred up and down and then stops at each zone of the preliminary heating zone, the full heating zone, and the cooling zone in consonance with a condition with requested process time.

On the other hand, in JP-A No. 11-233934 (hereinafter "Patent Literature 5"), there is provided a soldering apparatus comprising in a chamber with an open/close system: a hot plate, in which at least a part where a substrate is placed is flat, including a heating means; a cooling plate having a face capable of being tightly in contact with the hot plate, wherein the cooling plate is provided so as to go forward and backward against the hot plate; wherein the chamber is connected with a vacuum exhaust pump, a supply source for supplying carboxylic acid vapor, and another supply source for supplying non-oxidizing gas.

SUMMARY

However, each one of the apparatus described in Patent Literatures 1 to 3 does not include a cooling apparatus. Then there is a problem that it takes much time to complete solidification of solder, resulting in poor efficiency because cooling after heating depends on natural cooling with respect to the member for soldering. Furthermore, in the case of an apparatus described in Patent Literature 4, as every zone needs each space for a preliminary heating zone, a full heating zone, and a cooling zone, there is limitation for miniaturizing the apparatus. Moreover, in the case of an apparatus described in Patent Literature 5, as a structure is configured to heat the member for soldering through contact-type thermal conduction so that the member for soldering is placed on a hot plate with a heating apparatus such as a sheathed heater, there is a problem that residual heat remaining in a hot plate results in poor efficiency of cooling through the cooling plate even when stopping energizing to the sheathed heater.

In view of these problems, the present disclosure provides a heating and cooling device capable of performing heating and cooling processes in an airtight processing chamber, and capable of realizing miniaturization of the apparatus in conjunction with increasing the heating and cooling efficiency.

In order to achieve the benefits described above, there is provided a heating and cooling device comprising: an airtight processing chamber having an open/close system capable of loading and unloading a member-to-be-processed; an induction heating apparatus including one or a plurality of induction heating coils by which the member-to-be-processed is heated; a cooling apparatus cooling down the member-to-be-processed; a temperature sensor for determining a temperature of the member-to-be-processed; and a control apparatus controlling the induction heating apparatus and the cooling apparatus on the basis of the temperature determined by the temperature sensor; wherein a transfer apparatus is disposed so that the member-to-be-processed and/or a cooling unit of the cooling apparatus are transferred to change a distance between the member-to-be-processed and the cooling unit of the cooling apparatus.

According to the heating and cooling device of the present disclosure, as the member-to-be-processed disposed in the inside of the airtight chamber is heated or cooled, the heating and cooling device is suitable to perform, for example, a solder reflow process under reducing gas atmosphere. Then as the heating and cooling device heats directly a component capable of being heated through induction heating, the heating process can be performed without being effected by the cooling apparatus even when the cooling apparatus is disposed so as to abut onto or to come close to the member-to-be-processed. When making a raise in temperature in the member-to-be-processed, the cooling apparatus is released from the member-to-be-processed by using the transfer apparatus, decreasing cooling capability. Then the member-to-be-processed can be heated sharply. Further, when keeping the member-to-be-processed at a constant temperature, the cooling apparatus comes close to the member-to-be-processed by using the transfer apparatus, making a balance between heating and cooling. Then the temperature of the member-to-be-processed can be controlled with a higher precision. Furthermore, when making a drop in temperature in the member-to-be-processed, cooling can be performed sharply so that the cooling apparatus abuts onto the member-to-be-processed by using the transfer apparatus. In conjunction with increasing efficiency with regard to heating and cooling to shorten operating hours, the processes including heating and cooling steps described above can be performed so that the heating step and the cooling one are operated continuously without shifting the member-to-be-processed in horizontal direction in the chamber. Then the heating and cooling device may be miniaturized.

In the heating and cooling device of the present disclosure, the induction heating coil may be disposed toward a lower place than the member-to-be-processed, and the cooling unit may be configured so as to make a one-piece design with a cooling system and the induction heating coil.

The cooling unit of the cooling apparatus for cooling the member-to-be-processed is configured so as to make the one-piece design with the cooling system and the induction heating coil. Then a space where a member is provided can be saved in the chamber, so that the chamber may be miniaturized.

In the heating and cooling device of the present disclosure, the cooling system, in which the induction heating coil has a hollow-structure, may be configured to form a flow path capable of circulating a coolant.

According to an aspect described above, the induction heating coil with the hollow-structure allows the coolant to be circulated through the flow path. When circulating, for example, cooling water into the hollow-structure, the member-to-be-processed and the induction heating coil may be cooled with efficiency.

In the heating and cooling device of the present disclosure, the cooling unit may include a cooling plate abutting onto the upper surface of the induction heating coil with the hollow-structure during cooling.

According to another aspect described above, when making a raise in temperature in the member-to-be-processed, the cooling plate is released from the member-to-be-processed by using the transfer apparatus, and then the member-to-be-processed can be heated by the induction heating coil. Further, when making a drop in temperature in the member-to-be-processed, the member-to-be-processed may be cooled sharply as the cooling plate abuts onto the member-to-be-processed by using the transfer apparatus.

The heating and cooling device according to the present disclosure may include: another cooling plate positioned between the member-to-be-processed and the induction heating coil; and another flow path, which circulates another coolant as the cooling system, disposed toward a lower place than the cooling plate, wherein the induction heating coil is dipped in the coolant.

According to still another aspect described above, circulating the coolant into the flow path results in cooling the cooling plate. Hence, the member-to-be-processed may be cooled by the cooling plate cooled during cooling.

In the heating and cooling device of the present disclosure, the cooling plate may be formed of ceramics such as silicon carbide, silicon nitride, or aluminum nitride.

According to still another aspect described above, the member-to-be-processed can be heated even when the induction heating coil is disposed under the cooling plate. Further, rapid cooling can be performed due to heat exchange with the cooling plate when the member-to-be-processed that has been heated becomes to be in contact with the cooling plate. Then energy losses wasted due to heating and cooling may be decreased.

In the heating and cooling device of the present disclosure, an insulating cover, which is formed of a heatproof insulation material, may be disposed so as to cover a surface of the induction heating coil.

According to still another aspect described above, the insulating cover composed of a heatproof insulation material (such as ceramics, poly(tetra-fluoro-ethylene) resin, or the like) covers the surface so as to avoid exposition of the induction heating coil, so that this can prevent the induction heating coil from making a short circuit with conductive dust particles or foreign matters which are deposited on the induction heating coil when the member-to-be-processed is heated. This can prevent discharge from occurring between conductive components. Then the heating and cooling device can be operated in safe without performing maintenance over an extended time period.

In the heating and cooling device of the present disclosure, the cooling unit may be disposed toward a lower place than the member-to-be-processed, and the induction heating coil may be provided to an upper place than the member-to-be-processed.

According to still another aspect described above, as a distance between the member-to-be-processed and the induction heating coil can get near even though they are not in contact with each other, the member-to-be-processed can be heated with efficiency. Moreover, as any impediments such as the cooling plate do not exist between the member-to-be-processed and the induction heating coil, heating efficiency may become higher.

In the heating and cooling device of the present disclosure, the cooling unit may be disposed toward the lower place than the member-to-be-processed, and the induction heating coil may be provided toward another lower place than the cooling unit.

According to the constitution described above, even when the members-to-be-processed which have different heights with each other are processed continuously, the height adjustment may be omitted with respect to the distance between the member-to-be-processed and the induction heating coil. Then, this may result in improving workability.

In the heating and cooling device of the present disclosure, the control apparatus may control the induction heating apparatus and the cooling apparatus on the basis of the temperature determined by the temperature sensor shielded from the induction heating coil electromagnetically by using parameters: a wave number and a live current provided to the induction heating apparatus; a flow rate and another temperature of a coolant provided to the cooling apparatus at an inlet; and a distance between the member-to-be-processed and the cooling plate.

According to still another aspect described above, the control apparatus can control parameters related to the heating and the cooling precisely on the basis of electric signals, resulting in controlling the induction heating apparatus and the cooling apparatus. Further, the temperature sensor is disposed so as to be shielded from the induction heating coil electromagnetically and then may determine the temperature of the member-to-be-processed with precision.

The heating and cooling device according to the present disclosure may comprise: an evacuation apparatus connected to the processing chamber; a reducing gas supply apparatus introducing a reducing gas into the processing chamber; an inert gas supply apparatus introducing an inert gas into the processing chamber; wherein the control apparatus controls the evacuation apparatus, the reducing gas supply apparatus, and the inert gas supply apparatus.

According to still another aspect described above, after evacuating the processing chamber by controlling the evacuation apparatus, the control apparatus allows the reducing gas supply apparatus to introduce the reducing gas into the processing chamber. Then a reduction reaction may be performed to the surface of the member-to-be-processed. Furthermore, the control apparatus allows the inert gas supply apparatus to introduce the inert gas into the chamber, so that the inert gas can be substituted with the reducing gas. Then this can result in opening the chamber to the atmosphere with safety.

The heating and cooling device according to the present disclosure may comprise a pressure gauge for determining an internal pressure of the processing chamber, wherein the control apparatus controls the evacuation apparatus to diminish the pressure of the processing chamber and then obtains the internal pressure of the processing chamber, which is determined by the pressure gauge, so that the control apparatus controls output so as to convert the internal pressure into the maximum live current on the basis of the parameters with respect to the wave number and the live current provided to the induction heating apparatus.

According to still another aspect described above, the control apparatus is configured to obtain, for example, the internal pressure of the processed chamber, which is under a depressurized state, by using the pressure gauge and to perform a calculation in which the internal pressure and the heating position of the member-to-be-processed are considered, so that the maximum live current allowable to the induction heating coil is output immediately in the range that discharge will not occur in the chamber. This allows the control apparatus to heat the member-to-be-processed even when the chamber is controlled to be under diminished pressure. For example, when solder material for soldering the member-to-be-processed is molten, a generated gas is easily exhausted. Then this may result in decreasing defects, improving quality for soldering.

In the heating and cooling device of the present disclosure, the induction heating coil may be formed of one or a plurality of coils having a vertically-oriented-elliptical shape in longitudinal direction with a constriction positioned around the center thereof and may be disposed in parallel with the member-to-be-processed.

According to still another aspect described above, forming such a coil shape can prevent heat from concentrating in the vicinity of center position of the tray where the member-to-be-processed is placed. This may results in having excellent thermal uniformity in the member-to-be-processed even though a principal surface of the member-to-be-processed has, for example, a rectangular shape.

In the heating and cooling device of the present disclosure, two sets or more of the induction heating apparatus and the cooling apparatus may be disposed for one processing chamber.

According to still another aspect described above, all parts can be shared except the induction heating coil and the cooling unit. Further, when a heating and cooling unit being two times or more as much as a conventional unit is accommodated, two times or more members-to-be-processed can be processed in heating and cooling at once. Then this may result in cutting costs and improving in throughput substantially.

The heating and cooling device according to the present disclosure may include a pressing unit with which a tray is pressed to the cooling unit, wherein the tray on which the member-to-be-processed is placed is cooled when the tray is in contact with the cooling unit.

According to still another aspect described above, when the tray on which the member-to-be-processed is placed is cooled in a state where the tray is in contact with the cooling unit, the pressing unit presses the tray to the cooling unit. This may increase the contact area where the tray is in contact with the cooling unit, improving cooling efficiency.

According to the heating and cooling device of the present disclosure, as the transfer apparatus can transfer one or both of the member-to-be-processed and the cooling unit of the cooling apparatus, the member-to-be-processed can be heated and cooled with efficiency.

BRIEF DESCRIPTION OF THE DRAWINGS

FIG. 5 illustrates still another diagrammatic sketch according to still another embodiment of the heating and cooling device of the present disclosure (including the induction heating coil having the hollow-structure and a cooling plate).

DESCRIPTION OF EMBODIMENTS

Hereinafter, referring to FIG. 1, one embodiment of a heating and cooling device of the present disclosure will be described.

Figure 1:
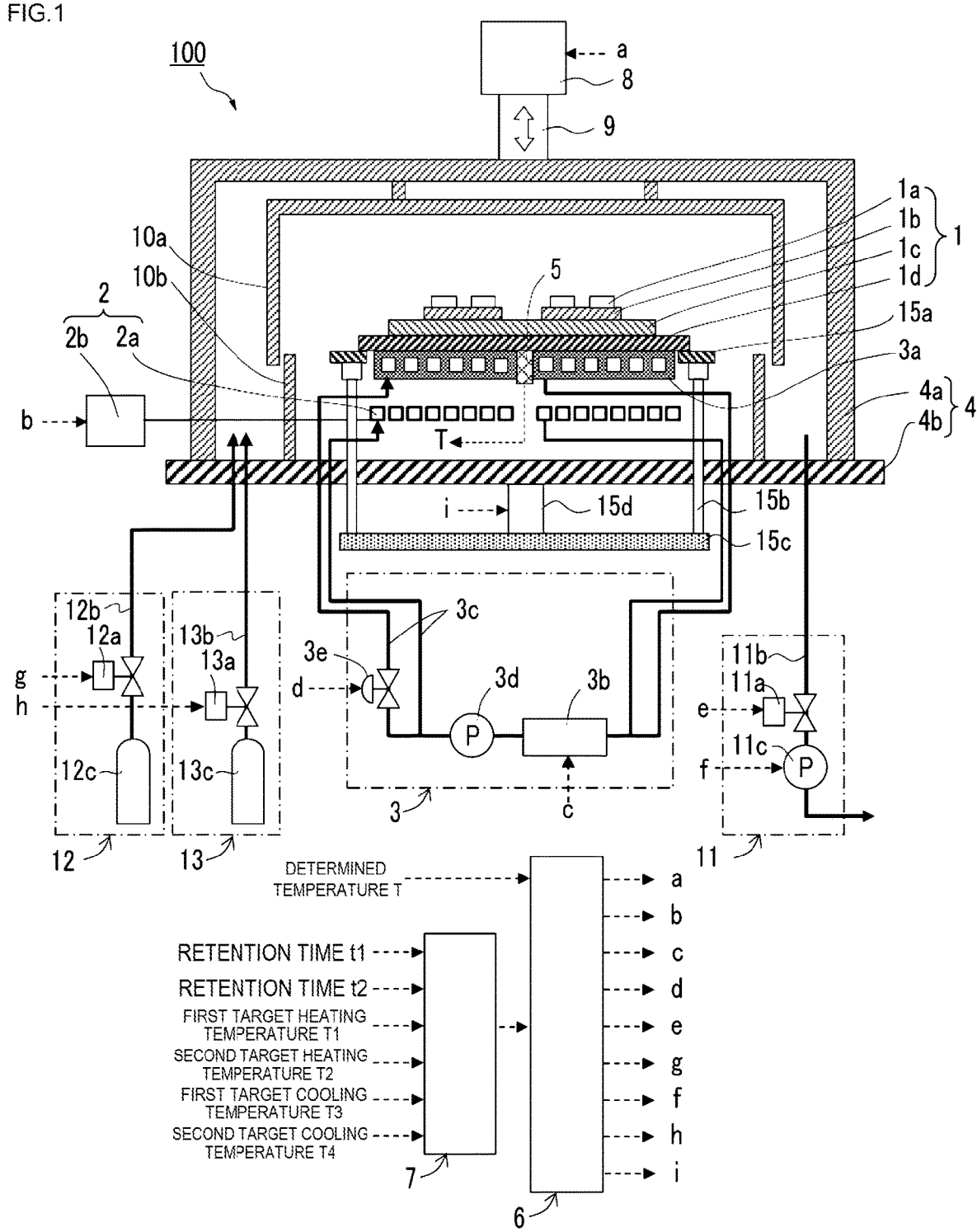
FIG. 1 shows a diagrammatic sketch according to one embodiment of a heating and cooling device of the present disclosure.

FIG. 1 shows a diagrammatic sketch of a heating and cooling device 100. The heating and cooling device 100 comprises: an airtight processing chamber 4 having an open/close system capable of loading and unloading a member-to-be-processed 1; a cooling unit 3a of a cooling apparatus 3 disposed toward a lower place than the member-to-be-processed 1; an induction heating coil 2a of an induction heating apparatus 2 disposed toward a further lower place than the cooling unit 3a; a transfer apparatus 15 for changing a distance between the member-to-be-processed 1 and the cooling unit 3a; a temperature sensor 5 for determining a temperature of the member-to-be-processed 1; a control apparatus 6 for controlling the induction heating apparatus 2 and the cooling apparatus 3 on the basis of the determined temperature; and an inputting apparatus 7 for inputting a signal to the control apparatus 6.

According to the present disclosure, as the induction heating coil 2a and the cooling unit 3a are placed in vertical orientation installation to the member-to-be-processed 1, the apparatus can be miniaturized in a greater extent in comparison with a conventional case that the heating unit and the cooling unit are placed in horizontal orientation installation thereto.

Hereinafter, each component will be described in detail for their configuration.

The processing chamber 4 is configured to have an airtight chamber including a lid unit 4a and a bottom unit 4b. Then the lid unit 4a is supported with a shaft 9 extended from an open/close apparatus 8, moving up and down with the shaft 9 as indicated with an arrow shown in FIG. 1, being capable of performing open/close operation to the bottom unit 4b. Heat-shielding covers 10a and 10b can be installed to the inside of the upper surface of the lid unit 4a so as to reflect infrared emission radiated from the member-to-be-processed 1 in order to enter the light again to the member-to-be-processed 1. Here, the heat-shielding covers 10a and 10b are configured so as to avoid interfering with heating generated from the induction heating apparatus 2. On the other hand, an evacuation apparatus 11 is connected to the processing chamber 4, evacuating the processing chamber 4. Further a reducing gas supply apparatus 12 and an inert gas supply apparatus 13 are connected to the processing chamber 4, supplying a reducing gas or an inert gas to the processing chamber 4.

The induction heating apparatus 2 is configured of an induction heating coil 2a and a power supply 2b. Induction heating is described as a method so that an alternative current is energized to the induction heating coil 2a, and then the member-to-be-processed 1 is heated through joule heating due to an eddy-current, which is generated to a conductive portion of the member-to-be-processed 1 with magnetic flux change. In comparison with other non-contact heating apparatus, the structure is simple, being miniaturized to be disposed even in the processing chamber 4. Furthermore as wear-susceptible components are eliminated, it is suitable to operate continuously without maintenance.

However, when the member-to-be-processed 1 is configured of a metal, which is a non-magnetic material having low electrical resistance, for example, copper, it is difficult to perform induction heating directly. Then the member-to-be-processed 1 is placed on a heated member configured of material susceptible to be heated through induction heating and then heated through induction heating by using the induction heating coil 2a, being heated indirectly through thermal conduction from the heated member that has been heated. A tray 1d, which is formed of the heated member, is preferably configured of, for example, carbon or a metal with high electrical resistance, and a shape thereof is not limited to a particular one. In addition, the heated member is not necessarily required for preparing any special components. The tray 1d formed of carbon or the like is capable of obtaining a similar effect.

A shape of the induction heating coil 2a is not limited to a particular one. There can be employed in a state where a conductive wire is wound up, for example, a flat plate whose outside shape of the principal surface with a space around the center thereof has a circular or vertically-oriented-elliptical figure or another flat plate whose outside shape of the principal surface with a constriction around the center thereof has a gourd-shaped figure.

A cooling apparatus 3 is configured of the cooling unit 3a, a heat exchanger 3b, coolant piping 3c connecting the cooling unit 3a and the heat exchanger 3b in a circular manner, a circulating pump 3d circulating a coolant filled in the coolant piping 3c between the cooling unit 3a and the heat exchanger 3b, and a flow rate regulating valve 3e for adjusting the flow rate of the coolant circulating through the cooling unit. In these components, the heat exchanger 3b, the circulating pump 3d, and the flow rate regulating valve 3e are provided outside the processing chamber 4. Then the heat exchanger 3b is configured so as to flow fluid, which passes through another piping not shown, for cooling the coolant flowing in the coolant piping 3c through exchanging heat between the coolant and the fluid.

A method for operating the cooling apparatus 3 is not limited to a particular one. For example, while operating the circulating pump 3d all the time, coolant distribution to the cooling unit 3a can be interrupted or adjusted in flow rate with the flow rate regulating valve 3e. Concretely, when the member-to-be-processed 1 is heated, the coolant circulation to the cooling unit 3a can be interrupted. During a period of time when retaining the member-to-be-processed 1 at a constant temperature, in conjunction with an amount of electric current with respect to AC power passing the induction heating coil 2a and/or a wave number thereof, the flow rate of the coolant can be adjusted with the flow rate regulating valve 3e. When the member-to-be-processed 1 is cooled, supplying power to the induction heating coil 2a is interrupted, and then increasing the amount of coolant circulation to the cooling unit 3a by opening the flow rate regulating valve 3e widely allows the member-to-be-processed 1 to cool down rapidly.

The cooling unit 3a can be configured of, for example, a plate-like component comprising a flow path, which circulates a coolant, disposed on the bottom unit 4b in the processing chamber 4. The quality of material of the cooling unit 3a is not limited to a particular one, having preferably sufficient heat-resistant properties and excellent heat transfer properties. Moreover, when the non-contact heating apparatus corresponds to the induction heating apparatus, the cooling unit 3a is preferably an insulator through which magnetic flux passes so as to avoid performing induction heating. Concretely, silicon carbide, ceramics, quartz glass, and the like can be employed. In particular, silicon carbide is more preferably employed as it has excellent thermal conductivity.

Further, the induction heating coil 2a can be configured of a hollow-structure pipe. Then coolant piping 3c is branched from a point short of the flow rate regulating valve 3e at the outlet side of the circulating pump 3d, allowing the coolant to be distributed to the induction heating coil 2a. This allows the induction heating coil 2a to cool.

A transfer apparatus 15 is configured of a frame 15a for supporting the member-to-be-processed 1, a plurality of up-and-down shafts 15b for moving the frame 15a up and down, an up-and-down base 15c to which the up-and-down shafts 15b are installed, and an up-and-down actuator 15d for driving the up-and-down base 15c, and then the member-to-be-processed 1 is transferred up and down, leading to alternation of a distance between the member-to-be-processed 1 and the cooling unit 3a. When the up-and-down actuator 15d is constructed, the up-and-down base 15c is lifted, and then the member-to-be-processed 1, which is supported on the frame 15a attached to each edge of the up-and-down shafts 15b, is elevated to leave from the cooling unit 3a. On the contrary, when the up-and-down actuator 15d is extended, the up-and-down base 15c is transferred downward, and then the member-to-be-processed 1, which is supported on the frame 15a attached to each edge of the up-and-down shafts 15b, is transferred downward to become in contact with the cooling unit 3a. When making a raise in temperature in the member-to-be-processed 1, the member-to-be-processed 1 is left from the cooling unit 3a to achieve heating rapidly. Furthermore in the case of keeping the member-to-be-processed at a constant temperature, the cooling unit 3a is approached closely to the member-to-be-processed 1 to balance between heating and cooling. This results in controlling the temperature of the member-to-be-processed 1 precisely. Moreover in the case of performing a drop in temperature in the member-to-be-processed 1, the member-to-be-processed 1 abuts onto the cooling unit 3a to cool down swiftly.

In addition, the transfer apparatus 15 may be another type of apparatus that transfers the cooling unit 3a to change a distance between the member-to-be-processed 1 and the cooling unit 3a while keeping the position of the member-to-be-processed 1.

A temperature sensor 5 is not limited to a particular one. There can be employed, for example, a thermocouple, an infrared emission thermometer, and the like. However, it is preferable that the temperature sensor 5 is a kind of sensor unaffected through the induction heating or has a structure shielded electromagnetically so as to avoid performing induction heating directly. In the examples described above, the infrared emission thermometer is the kind of temperature sensor unaffected through induction heating. When the temperature sensor 5 corresponds to the thermocouple, it is preferable that a core part of the wire is shielded with a sheath so as to avoid heating through induction heating directly. Further if the temperature sensor 5 is in contact with the cooling unit 3a in the vicinity of the edge thereof, the temperature sensor may receive any effect from the cooling unit 3a whose temperature is low. Then it is preferable to provide at least a gap between the edge of the temperature sensor 5 and the cooling unit 3a. The temperature sensor may be provided multiply. Input values determined by the multiple sensors are calculated to obtain an average, and then a deviation is minimized from a target value. Thus this increases reliability regarding the temperature.

The evacuation apparatus 11 is configured of piping 11b having a valve 11a and a vacuum pump 11c. The vacuum pump 11c is not limited to a particular one. There can be employed, for example, a rotary pump, a diaphragm pump, a piston-type pump, and the like. However, when some reducing gas is exhausted, the vacuum pump 11c is preferably an explosion proof type for safety.

The reducing gas supply apparatus 12 is configured of piping 12b having a valve 12a and a reducing gas cylinder 12c. Gases used as the reducing gas may include, for example, hydrogen, formic acid, formaldehyde, or the like.

The inert gas supply apparatus 13 is configured of piping 13b having a valve 13a and an inert gas cylinder 13c. Gases used as the inert gas may include, for example, nitrogen, argon, or the like.

The control apparatus 6 comprises at least a memory configured of a RAM, a ROM, a magnetic disk, an optical disk, and the like; and an arithmetic unit including a CPU, not shown in figures, being configured so that a control signal is transmitted to each one of the apparatus through the arithmetic unit on the basis of a program and data stored in the memory. The inputting apparatus 7 and an indication apparatus configured of a display, a printer, and the like, not shown, are connected to the control apparatus 6. The data stored in the memory of the control apparatus 6 can be inputted from the inputting apparatus 7 connected to the control apparatus 6. The data inputted from the inputting apparatus 7 includes, for example, a retention time t1, a retention time t2, a first target heating temperature T1, a second target heating temperature T2, a first target cooling temperature T3, a second target cooling temperature T4, and the like. Further as described above, a temperature T of the member-to-be-processed 1, which is determined by the temperature sensor 5, and the like are further inputted to the control apparatus 6.

The control apparatus 6 is connected to the open/close apparatus 8, and then the lid unit 4a of the processing chamber 4 can be transferred up and down with a control signal a. Further the control apparatus 6 is connected to the power supply 2b of the induction heating apparatus 2, being capable of controlling output of the induction heating coil 2a with a control signal b. For example, the wave number and the amount of electric current with respect to AC power energized to the induction heating coil 2a can be controlled. Furthermore the control apparatus 6 is connected to the heat exchanger 3b of the cooling apparatus 3, being capable of controlling a temperature of the coolant with a control signal c. Moreover the control apparatus 6 is connected to the flow rate regulating valve 3e of the cooling apparatus 3, being capable of controlling the coolant flow rate with a control signal d. Further the control apparatus 6 is connected to the valve 11a of the evacuation apparatus 11, being capable of opening or closing the valve 11a with a control signal e. Furthermore the control apparatus 6 is connected to the vacuum pump 11c of the evacuation apparatus 11, being capable of turning the vacuum pump 11c on/off with a control signal f. Moreover the control apparatus 6 is connected to the valve 12a of the reducing gas supply apparatus 12, being capable of opening or closing the valve 12a with a control signal g. Further the control apparatus 6 is connected to the valve 13a of the inert gas supply apparatus 13, being capable of opening or closing the valve 13a with a control signal h. Furthermore the control apparatus 6 is connected to the up-and-down actuator 15d of the transfer apparatus 15, being capable of changing a distance between the member-to-be-processed 1 and the cooling unit 3a with a control signal i.

Then the control apparatus 6 can control the temperature of the member-to-be-processed 1 with parameters such as the wave number and the live current provided to the induction heating coil 2a, the flow rate and the temperature of the coolant provided to the cooling unit 3a at an inlet, and the distance between the member-to-be-processed 1 and the cooling unit 3a.

Next, the heating and cooling device 100 according to the present disclosure will be described with respect to one example of embodiments in the case of soldering a semiconductor module.

The member-to-be-processed 1 is, for example, configured of a semiconductor element 1a, an insulating substrate 1b having metal foil on each face of both faces of an insulating plate, a base plate 1c, and a tray 1d. There may be a plurality of semiconductor elements in the member-to-be-processed 1. The semiconductor element is glued on a predetermined position where the metal foil is mounted on the upper surface of the insulating substrate through solder paste. Further the base plate 1c is glued on the metal foil placed on the bottom face of the insulating substrate 1b through solder paste. When the tray 1d, which also serves as a transfer jig, is placed on the cooling unit 3a, it is configured so that the bottom face of the tray 1d abuts onto the upper face of the cooling unit 3a and the edge of the temperature sensor 5 buried in the cooling unit 3a.

The quality of material is not limited to a particular one with regard to the tray 1d. There may be employed insulating materials such as, for example, ceramics and quartz glass and high-resistance material such as carbon or the like. When the tray 1d is made of the insulating material, the base plate 1c can be heated directly through induction heating due to magnetic flux transmitted. On the other hand, when the tray 1d is formed of the high-resistance material, the base plate 1c can be heated indirectly via thermal conduction from the tray 1d heated through induction heating. Such a configuration allows the member-to-be-processed 1 to be heated uniformly without depending on the quality of material with regard to the base plate 1c. Furthermore the tray 1d can be changed in shape appropriately so that the tray 1d can transfer multiple base plates 1c and perform heating and cooling processes. Hereinafter, a method for soldering the semiconductor module according to the heating and cooling device 100 will be described.

(1) Bringing In

The processing chamber 4 is opened so that the lid unit 4a of the processing chamber 4 is raised with the open/close apparatus 8, and the member-to-be-processed 1 is brought in and placed on the frame 15a. After that, the lid unit 4a of the processing chamber 4 is moved down by using the open/close apparatus 8, and then the processing chamber 4 is closed to make airtightness.

(2) Evacuating

The valve 11a of the evacuation apparatus 11 is opened, and then the inside of the processing chamber 4 is evacuated by using the vacuum pump 11c. Then the valve 11a is closed when the vacuum level approaches to a predetermined value. However, the valve 11a may be opened in the case of performing the reduction reaction under diminished pressure.

(3) Introducing Reducing Gas

The reducing gas is introduced from the reducing gas cylinder 12c to the processing chamber 4 while opening the valve 12a of the reducing gas supply apparatus 12. When the reducing gas is supplied to the processing chamber 4 with a predetermined pressure, the valve 12a is closed. However, in the case of performing the reduction reaction under diminished pressure, the valve 12a remains to be open, and then balancing with an evacuation rate can keep another predetermined pressure.

(4) First Heating (Reduction Process)

By using the induction heating apparatus 2, the member-to-be-processed 1 is heated to the first target heating temperature T1, and the temperature T of the member-to-be-processed 1 determined by the temperature sensor 5 remains to be the first target heating temperature T1 during the retention time t1. Then the member-to-be-processed 1 is heated preliminarily, and the surface of the member-to-be-processed 1 is reduced to increase wettability for soldering. The member-to-be-processed 1 is held in a state where a gap is created by using the transfer apparatus 15 so as to avoid being in contact with the cooling unit 3a during heating. This can block heat from escaping from the member-to-be-processed 1 to the cooling unit 3a, heating the member-to-be-processed 1 swiftly. The first target heating temperature T1 is set so as to be lower than a solder melting temperature. If solder is molten before the surface of the member-to-be-processed 1 is reduced sufficiently, a cold joint may be generated as voids are generated in the joint. Then it is required to control the temperature T of the member-to-be-processed 1 so as to avoid happening overshooting. The control apparatus 6 can perform feedback-control with respect to the output of the induction heating apparatus 2 so that the deviation from the first target heating temperature T1 is minimized regarding the temperature T determined by the temperature sensor 5.

The heating and cooling device 100 according to the present disclosure has an advantage that a temperature raising rate is fast because it utilizes a method for heating the member-to-be-processed 1 directly as a heating element by using the induction heating apparatus 2. Then this can shorten the heating time, increasing a throughput of the heating and cooling device.

(5) Second Heating (Solder Melting)

By using the induction heating apparatus 2, the member-to-be-processed 1 is heated to the second target heating temperature T2, and the temperature T of the member-to-be-processed 1 determined by the temperature sensor 5 remains to be the second target heating temperature T2 during the retention time t2 to melt the solder placed on the member-to-be-processed 1. The second target heating temperature T2 is set so as to be higher than the solder melting temperature. If the second target heating temperature T2 is set higher overly than the solder melting temperature, a solid phase reaction may proceed excessively in the solder joint face to become a cold joint. On the contrary, if the second target heating temperature T2 is set closer considerably to the solder melting temperature, solder might fail to melt in the place where the temperature is not raised sufficiently because of heating unevenness in the heating plate, resulting in a cold joint. Then it is required to determine the temperature T of the member-to-be-processed 1 precisely and to control the temperature properly. The control apparatus 6 can perform feedback-controlling with respect to the induction heating apparatus 2 so that the deviation from the second target heating temperature T2 is minimized regarding the temperature T determined by the temperature sensor 5. There can be controlled parameters such as the wave number and the live current being supplied to the induction heating coil 2a, the flow rate and the temperature of the coolant provided to the cooling unit 3a at the inlet, and the distance between the member-to-be-processed 1 and the cooling unit 3a.

(6) Cooling (Solder Solidification)

After stopping heating with the induction heating apparatus 2, the member-to-be-processed 1 becomes to be in contact with or comes close to the cooling unit 3a by using the transfer apparatus 15, being cooled with the cooling unit 3a. Further the control apparatus 6 can perform feedback-controlling with respect to the cooling apparatus so that the deviation from the first target cooling temperature T3 is minimized regarding the temperature T determined by the temperature sensor 5. The cooling unit 3a is configured of material that is not heated directly and then does not make a raise in temperature. This provides cooling for the member-to-be-processed 1 swiftly, resulting in shortening the time for cooling to increase the throughput of the heating and cooling device.

(7) Introducing Inert Gas

When the temperature T of the member-to-be-processed 1, which is determined by the temperature sensor 5, reaches to the second target cooling temperature T4, the inside of the processing chamber 4 is evacuated by using the vacuum pump 11 after opening the valve 11a of the evacuation apparatus 11 in a state where the valve 12a of the reducing gas supply apparatus 12 is closed. When the processing chamber 4 reaches a predetermined vacuum level, the valve 11a is closed, and the valve 13a of the inert gas supply apparatus 13 is opened. Then the inert gas is supplied from an inert gas cylinder 13c to the processing chamber 4. When the pressure of the processing chamber 4 goes back to the atmospheric pressure, the valve 13a is closed. During the period described above, the member-to-be-processed 1 is further cooled continuously with the cooling unit 3a.

(8) Carrying Out

When the processing chamber 4 is pulled open so that the lid unit 4a of the processing chamber 4 is raised with the open/close apparatus 8, the member-to-be-processed 1 is carried out. Then the open/close apparatus 8 allows the lid unit 4a of the processing chamber 4 to descend, closing the processing chamber 4.

As described above, the heating and cooling device according to the present disclosure is configured so as to perform the reduction process for improving solder wettability, the solder melting process, and the solder solidification process in the one processing chamber 4, being miniaturized in comparison with a conventional soldering apparatus. Further the cooling unit 3a is disposed toward a lower place than the member-to-be-processed 1, and the induction heating coil 2a of the induction heating apparatus 2 disposed toward a further lower place than the cooling unit 3a. According to this embodiment described above, even though each one of the members-to-be-processed 1 having different heights is processed continuously, a distance between the member-to-be-processed 1 and the induction heating coil 2a remains unchanged as the induction heating coil 2a is disposed toward the lower place than the cooling apparatus 3. Then it becomes unnecessary to adjust the height of the induction heating coil 2a again. This can improve workability. Furthermore only the semiconductor module being the member-to-be-processed 1 is inclined to be heated by the induction heating coil 2a, and then the inner wall of the processing chamber 4 and the cooling unit 3a are hardly heated. Then this eliminates waste for heating, performing further both heating and cooling of the semiconductor module sharply.

Next, the induction heating apparatus of the heating and cooling device according to the present disclosure will be described in detail in conjunction with the figures.

As described earlier, when the member-to-be-processed 1, which is the semiconductor module, is configured so that the semiconductor element 1a, the insulating substrate 1b, and the base plate 1c composed of copper are joined with solder, every portion thereof is difficult to heat through induction heating. Then it is easy to heat the portions indirectly through thermal conduction from the heated member. It is preferable that the base plate 1c is, for example, placed on the tray 1d formed of the carbon material. In order to heat the member-to-be-processed 1 uniformly, it is preferable that an outside shape of the tray 1d is bigger than an outside edge of the range where multiple base plates 1c are placed, and an outside shape of the induction heating coil 2a is preferably bigger than the outside shape of the tray 1d.

Figure 2A:
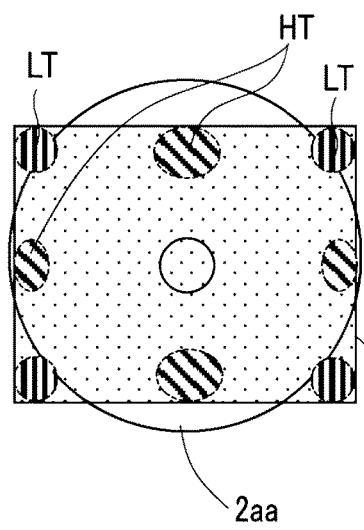
FIGS. 2A-C illustrate plan views showing examples of induction heating coils employed in the heating and cooling device of the present disclosure.
Figure 2B:
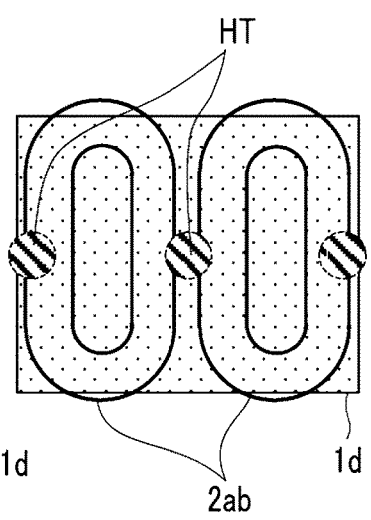
Figure 2C:
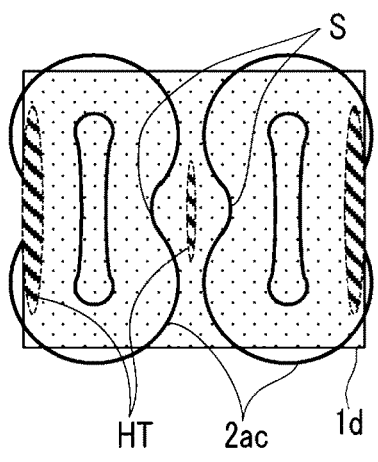

The shape of the induction heating 2a employed for the present disclosure is not limited to a particular one. For example, the induction heating coil shown in the plan views of FIGS. 2A-C can be employed therefor. FIGS. 2A-C illustrate only an outside shape of a bunch of windings but omits a shape of the conductive wire. Further the tray 1d, which is made of the heated member, is shown to be rectangular. FIG. 2A illustrates a flat-shaped induction heating coil 2aa in a state where the conductive wire is wound up so that an outside shape of the principal face having a space around the center thereof is circular. FIG. 2B illustrates another flat-shaped induction heating coil 2ab in a state where the conductive wire is wound up so that the outside shape of the principal face having another space around the center thereof is vertically-oriented-elliptical. FIG. 2C illustrates still another flat-shaped induction heating coil 2ac in a state where the conductive wire is wound up so that the outside shape of the principal face having still another space around the center thereof with a constriction S positioned around the center is vertically-oriented-elliptical, namely being gourd-shaped. These induction heating coils may be coils in which the conductive wire with insulating cover is wound up, or other coils in which the hollow-structure pipe composed of metal having excellent electric conductivity is wound up. Even though it has the hollow-structure, there is no influence with regard to loss and heating properties because the current passes through the metal surface.

In addition, FIG. 2A-C shows a high temperature portion HT and a low temperature portion LT schematically with a hatch pattern when the tray 1d is heated through induction heating. In the circular coil 2aa illustrated in FIG. 2A, the high temperature portions HT are generated around four sides of the tray 1d, and the low temperature portions LT created at four corners thereof. In two vertically-oriented-elliptical coils 2ab disposed in parallel illustrated in FIG. 2B, the high temperature portions HT are generated around the center of the tray 1d and along short sides. In particular, the tray 1d makes a raise readily in temperature around the center thereof because the center part is heated simultaneously from the liner portions of the two vertically-oriented-elliptical coils. Therefore, when a gourd-shaped coil 2ac having the constriction S positioned around the center is employed with the improvement of the vertically-oriented-elliptical coil 2ab, heat concentration generated around the center part of the tray 1d is alleviated, improving thermal uniformity as shown in FIG. 2C.

Figure 3A:
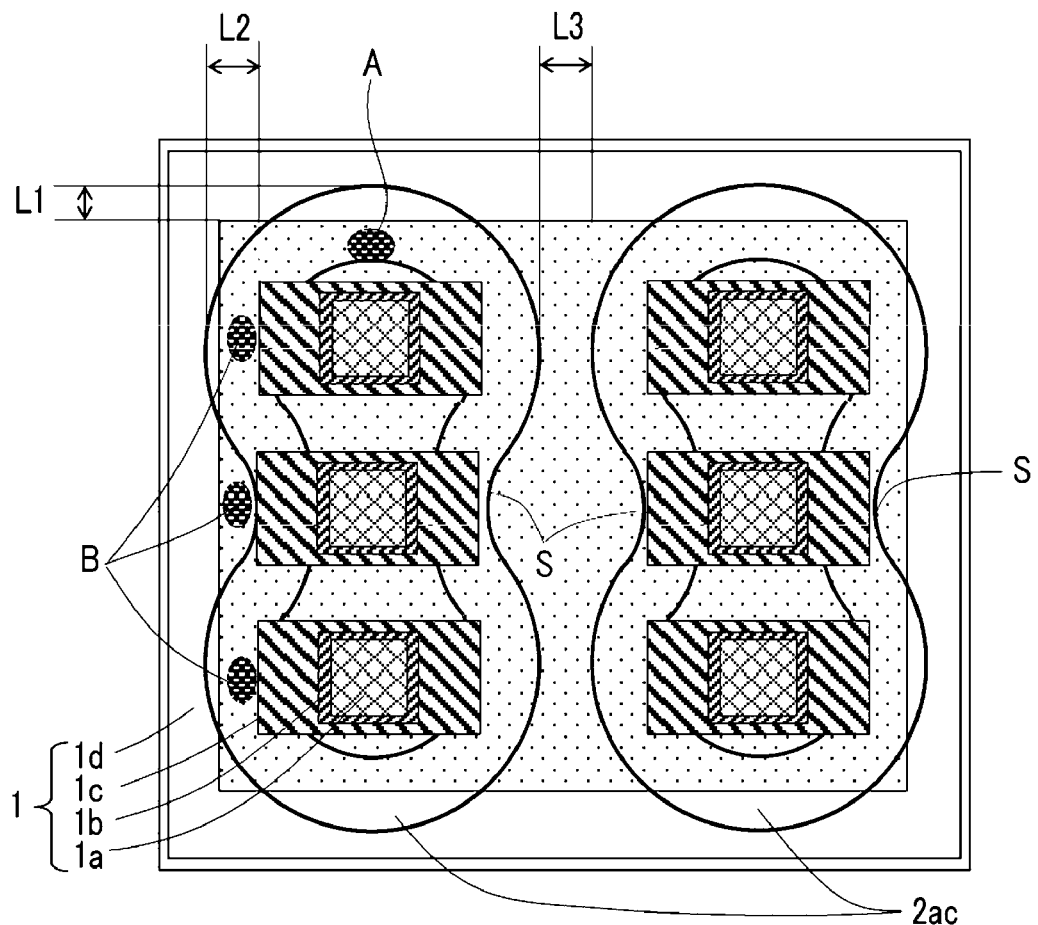
FIGS. 3A-B illustrate further diagrammatic sketches according to a gourd-shaped induction heating coil employed in the heating and cooling device of the present disclosure.
Figure 3B:
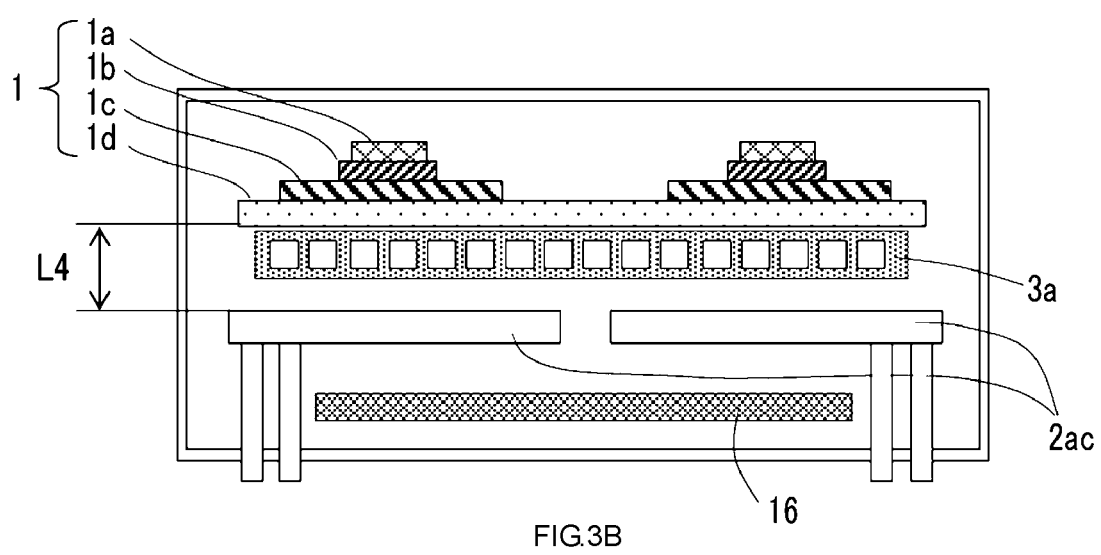

In addition, the gourd-shaped coil 2ac will be described in shape and configuration into details by using FIGS. 3A-B. Six pieces of members-to-be-processed 1 are placed on the upper surface of the tray 1d. Two pieces of gourd-shaped coils 2ac, in which the constrictions S are placed closely with each other, are disposed in parallel toward a lower place than the tray 1d.

At this point, the gourd-shaped coil 2ac has preferably the shape formed so that a space around the center and at least a part of the constriction S are disposed inside the periphery of the tray 1*d*. This accumulates magnetic lines of force of the induction heating coil to the inside of the tray 1*d*, heating the tray 1*d* with efficiency.

Increasing a distance L1 from an end of gourd-shaped coil in longitudinal direction to an outside edge of tray 1*d* can raise a heating value at the point A of the tray 1*d*. Further on a side having the constriction S of the gourd-shaped coil 2*ac*, increasing a distance L2 from the most jutting outside edge of gourd-shaped coil to an outside edge of a member-to-be-processed can raise another heating value at the point B of the tray 1*d*.

In the heating and cooling device according to the present disclosure, a distance L3 between the gourd-shaped coils 2*ac* disposed in parallel is preferably designed so that the heating values become nearly equal with each other regarding the point A and B. A position adjustment apparatus is more preferably provided to adjust thermal uniformity with respect to the tray 1*d*. Further a distance L4 between the gourd-shaped coil 2*ac* and tray 1*d* is preferably designed so as to obtain a proper difference between the periphery and the inside with regard to the flat plate in consideration of heat dissipating from the flat plate periphery. Another position adjustment apparatus is more preferably provided to adjust thermal uniformity with respect to the tray 1*d*.

Furthermore, in the heating and cooling device according to the present disclosure, winding directions of neighboring gourd-shaped coils 2*ac* are preferably opposite to each other. This configuration can heat the tray 1*d* with efficiency because magnetic field created from the two induction heating coils 2*ac* acts so as to strengthen the eddy-current.

In the heating and cooling device according to the present disclosure, a soft magnetic component 16 is preferably provided toward a lower position than the neighboring gourd-shaped coils 2*ac*. This configuration can connect one magnetic lines of force extending toward the lower direction than one induction heating coil to another magnetic lines of force of the gourd-shaped coil 2*ac* through the soft magnetic component 16, inverting magnetic field created around the underside of the gourd-shaped coil 2*ac* to an upper direction. Furthermore magnetic flux density distribution can be adjusted on the tray 1*d* when making an adjustment on the configuration of the soft magnetic component 16 against the gourd-shaped coil 2*ac*.

In addition, even though the induction heating coil is, without being limited to the gourd-shaped coil, the other type thereof having a different shape, the heating and cooling device according to the present disclosure can include the position adjustment apparatus capable of changing the distance L3 between induction heating coils disposed in parallel and the position adjustment apparatus capable of changing the distance L4 between the induction heating coil and the member-to-be-processed 1. Then it may be configured so that each one of the winding direction is in inverse manner with the neighboring induction heating coils. Then the soft magnetic component may be disposed toward a lower place than the induction heating coil.

Furthermore an example that two induction heating coils are disposed is described as shown above. However, there may be one or more than one induction heating coil disposed in parallel.

Next, in the heating and cooling device according to the present disclosure, another embodiment, in which an aspect of the cooling unit is changed, will be described in conjunction with figures.

Figure 4:
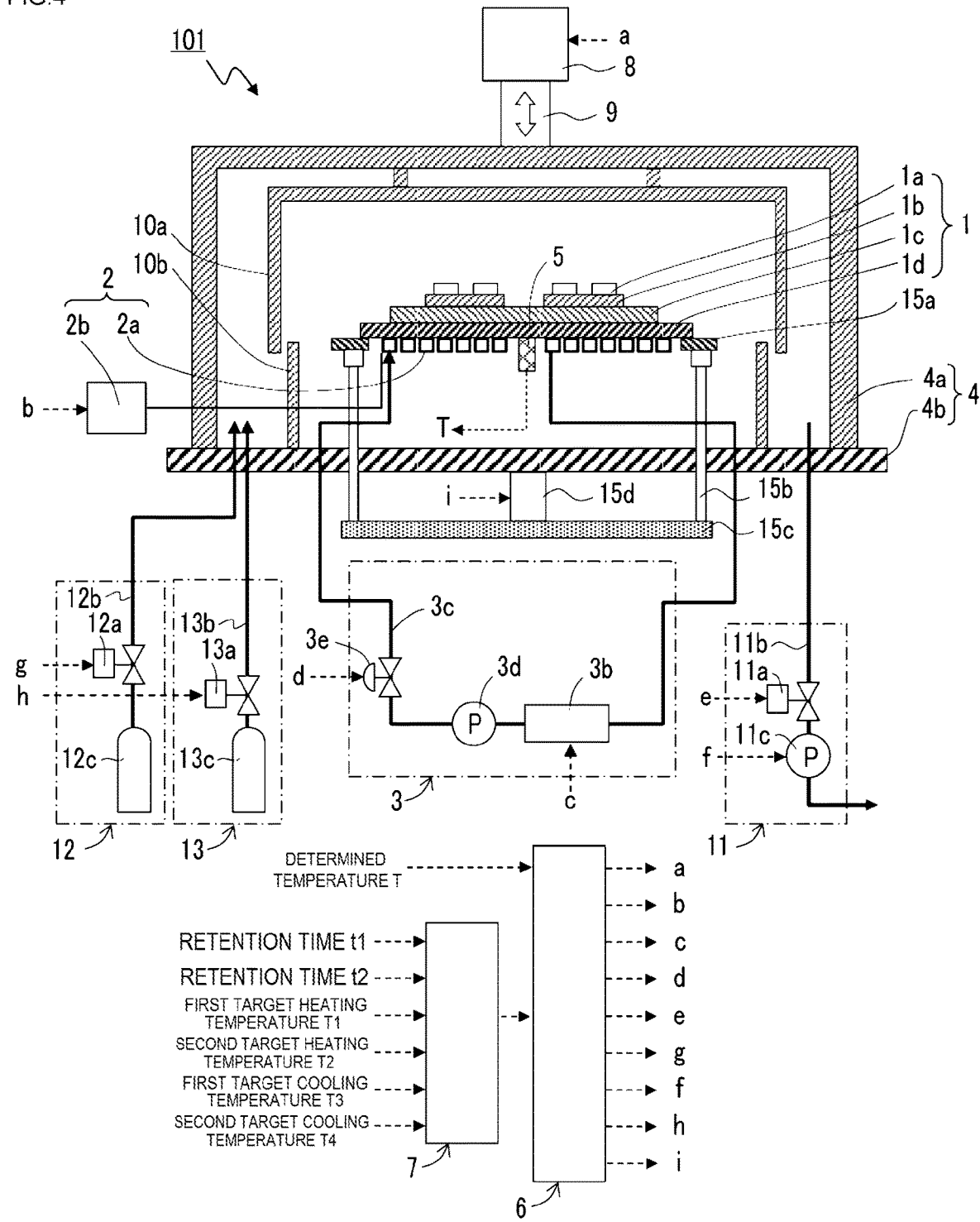
FIG. 4 illustrates still another diagrammatic sketch according to another embodiment of the heating and cooling device of the present disclosure (including an induction heating coil having a hollow-structure).

FIG. 4 illustrates a heating and cooling device 101 that another cooling unit is configured of the induction heating coil 2*a* having the hollow-structure in which the flow path capable of circulating coolant is formed and acts as not only the cooling unit but also the heating unit. When the transfer apparatus 15 allows the tray 1*d* to abut onto the induction heating coil 2*a*, which acts as the cooling unit, the tray 1*d* can be directly cooled. The face being contact with the tray 1*d* is preferably flattered regarding the cross section of the induction heating coil 2*a* to increase a contact area with the tray 1*d*. Concretely, the cross section preferably has a rectangular shape with the hollow-structure. This configuration allows the coolant to circulate through the induction heating coil 2*a* having the hollow-structure, suppressing self-heating of the induction heating coil 2*a*. Then this saves a space for installing, resulting in miniaturizing the processing chamber because the induction heating coil 2*a* acts as both the heating unit and the cooling one.

FIG. 5 illustrates a heating and cooling device 102, in which still another cooling unit serves as not only the cooling unit but also the heating unit, configured of: the induction heating coil 2*a* having the hollow-structure in which the flow path capable of circulating coolant is formed; a cooling plate 3*f*, composed of an insulating material, disposed to an upper position than the induction heating coil 2*a*; and a supporting plate 3*g*, composed of another insulating material, disposed toward a lower place than the induction heating coil 2*a*. When the transfer apparatus 15 allows the member-to-be-processed 1 to abut onto the cooling plate 3*f*, the member-to-be-processed 1 can be directly cooled. At this point, when heat capacity of the cooling plate 3*f* is excessively large, responsivity when heating or cooling becomes poor to result in longer process time. Therefore it is to be desired that cooling capacity adjustment and temperature fluctuation stabilization should be performed so that absorbed heat depending on a coolant circulating rate keeps the heat capacity of the cooling plate 3*f* in balance.

According to the above aspect of the disclosure, the induction heating coil 2*a* serves as both the heating unit and the cooling unit, and then the saving of the space for installing results in miniaturizing the processing chamber.

Figure 6A:
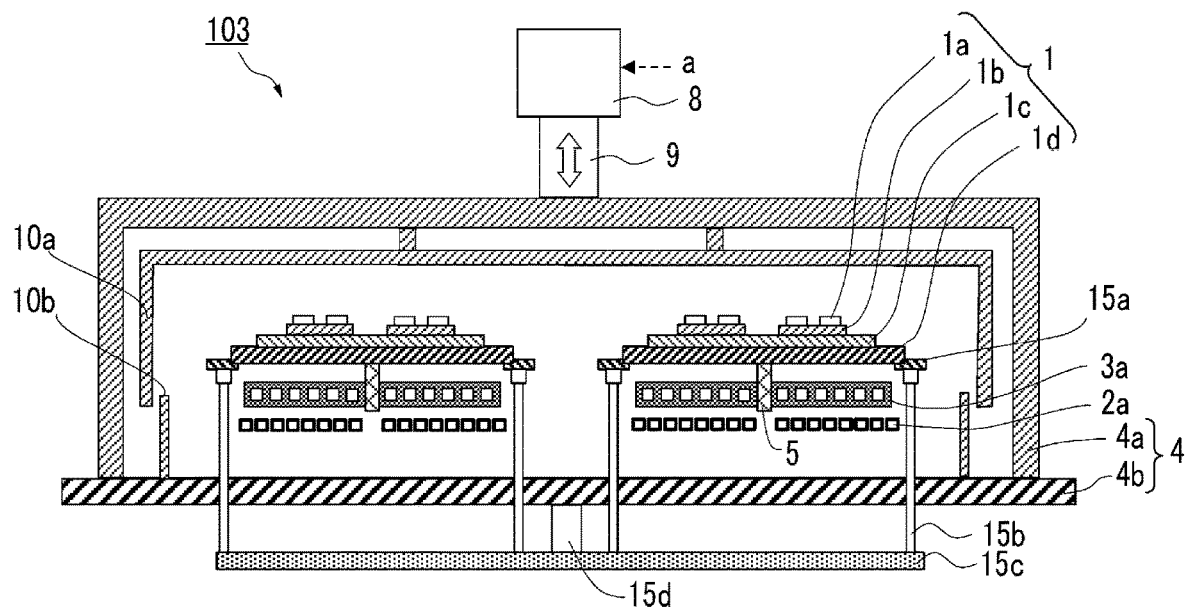
FIGS. 6A-B illustrate still further diagrammatic sketches according to still another embodiment of the heating and cooling device of the present disclosure (including a chamber in which two sets can be accommodated).
Figure 6B:
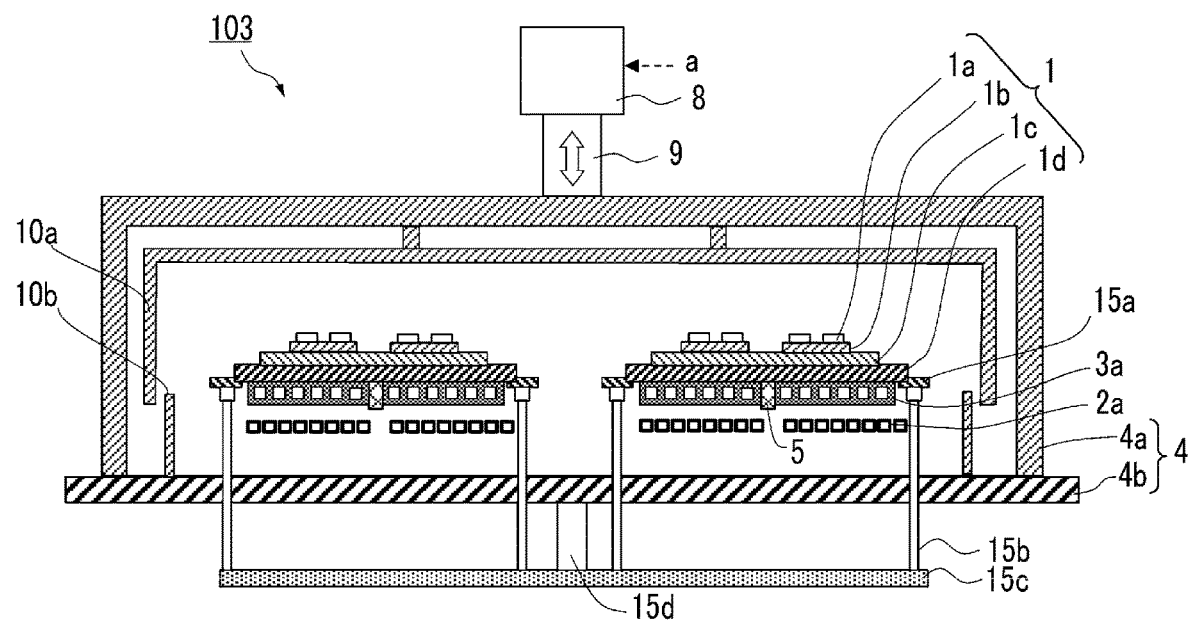

FIGS. 6A-B illustrate still another embodiment of the heating and cooling device according to the present disclosure. FIG. 6A shows a state where the member-to-be-processed 1 is separated from the cooling unit 3*a*, and then FIG. 6B another state where the member-to-be-processed 1 abuts onto the cooling unit 3*a*. A heating and cooling device 103 comprises two sets of induction heating coils 2*a* and the cooling units 3*a* in one processing chamber and then is configured so that two pieces of the members-to-be-processed 1 are processed simultaneously. According to the aspect described above, all the parts are shared but the induction heating coils 2*a* and the cooling unit 3*a*, and then twice as many as the conventional heating and cooling unit are accommodated. This cuts costs, improving in process throughput.

In addition, although a case using the two sets of induction heating coils 2*a* and the cooling units 3*a* is described above, multiple sets, which indicates two or more, may be provided in another case. Further each set may be operated simultaneously with one up-and-down actuator 15*d* or individually with each of up-and-down actuators 15*d* installed for each set. Operating each of the sets individually makes a distance between the member-to-be-processed 1 and the cooling unit 3*a* to be adjusted individually. This leads to easy temperature control.

Figure 7:
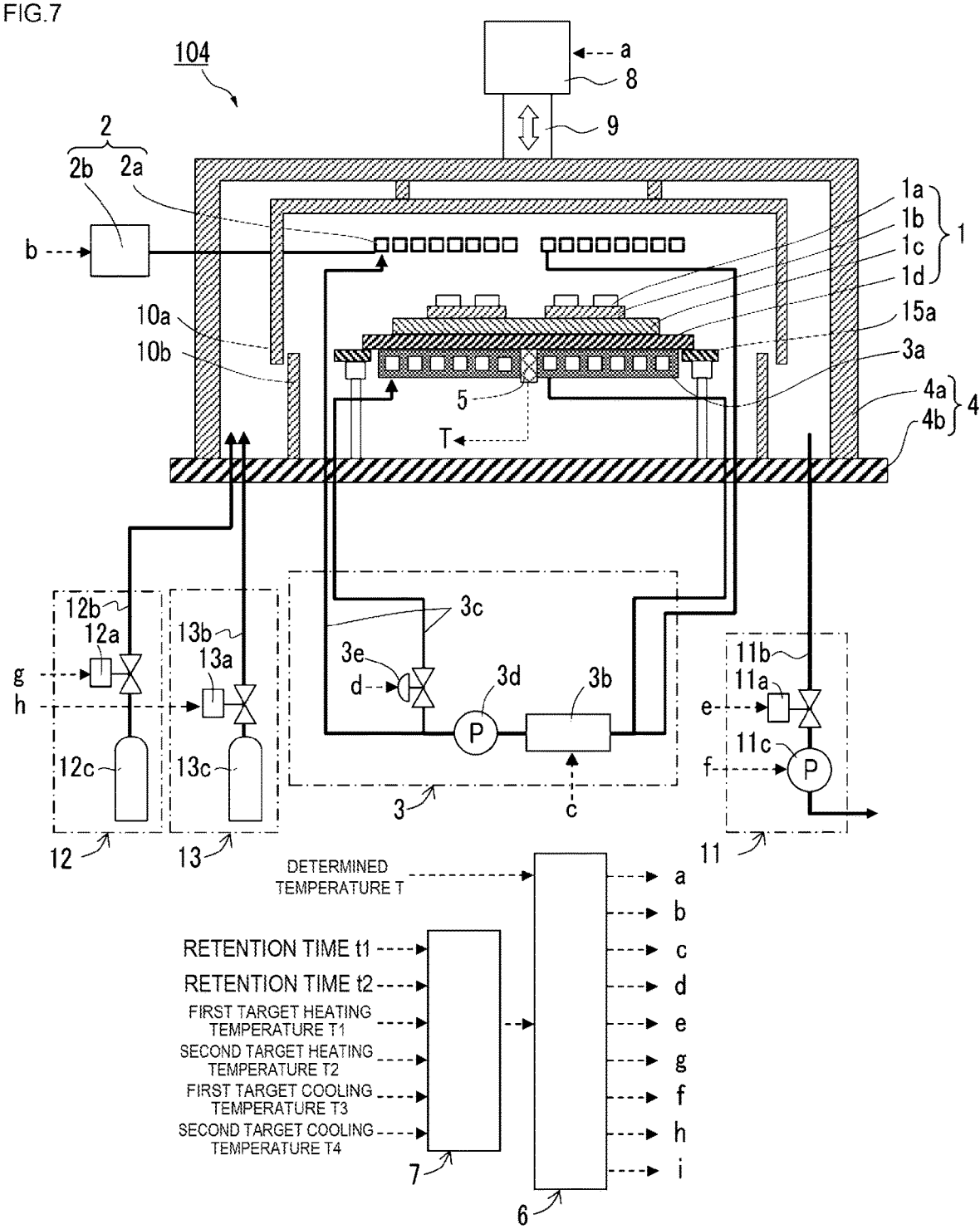
FIG. 7 illustrates still another diagrammatic sketch according to still another embodiment of the heating and cooling device of the present disclosure (including the induction heating coil disposed in a non-contact manner in the vicinity of the upper surface of the chamber).

FIG. 7 illustrates still another embodiment of the heating and cooling device according to the present disclosure. A heating and cooling device 104 is configured so that the induction heating coil 2*a*, which is a non-contact type, of the induction heating apparatus 2 is disposed toward an upper position than the member-to-be-processed 1, and then the cooling unit 3a of the cooling apparatus 3 disposed toward a lower place than the member-to-be-processed 1. Other structures are similar to the embodiment shown in FIG. 1.

According to this embodiment described above, as the member-to-be-processed 1 can approach to the induction heating coil 2a in closer distance, the member-to-be-processed 1 can be heated efficiently. Moreover, as there are no obstacles between the induction heating coil 2a and the member-to-be-processed 1, heating efficiency can be improved further.

Furthermore, with the configuration using the induction heating coil 2a having the hollow-structure, the coolant piping 3c is branched from this side of the flow rate regulating valve 3e at the outlet side of a circulating pump 3d. Then circulating the coolant through the induction heating coil 2a provides cooling for the induction heating coil 2a.

Figure 8:
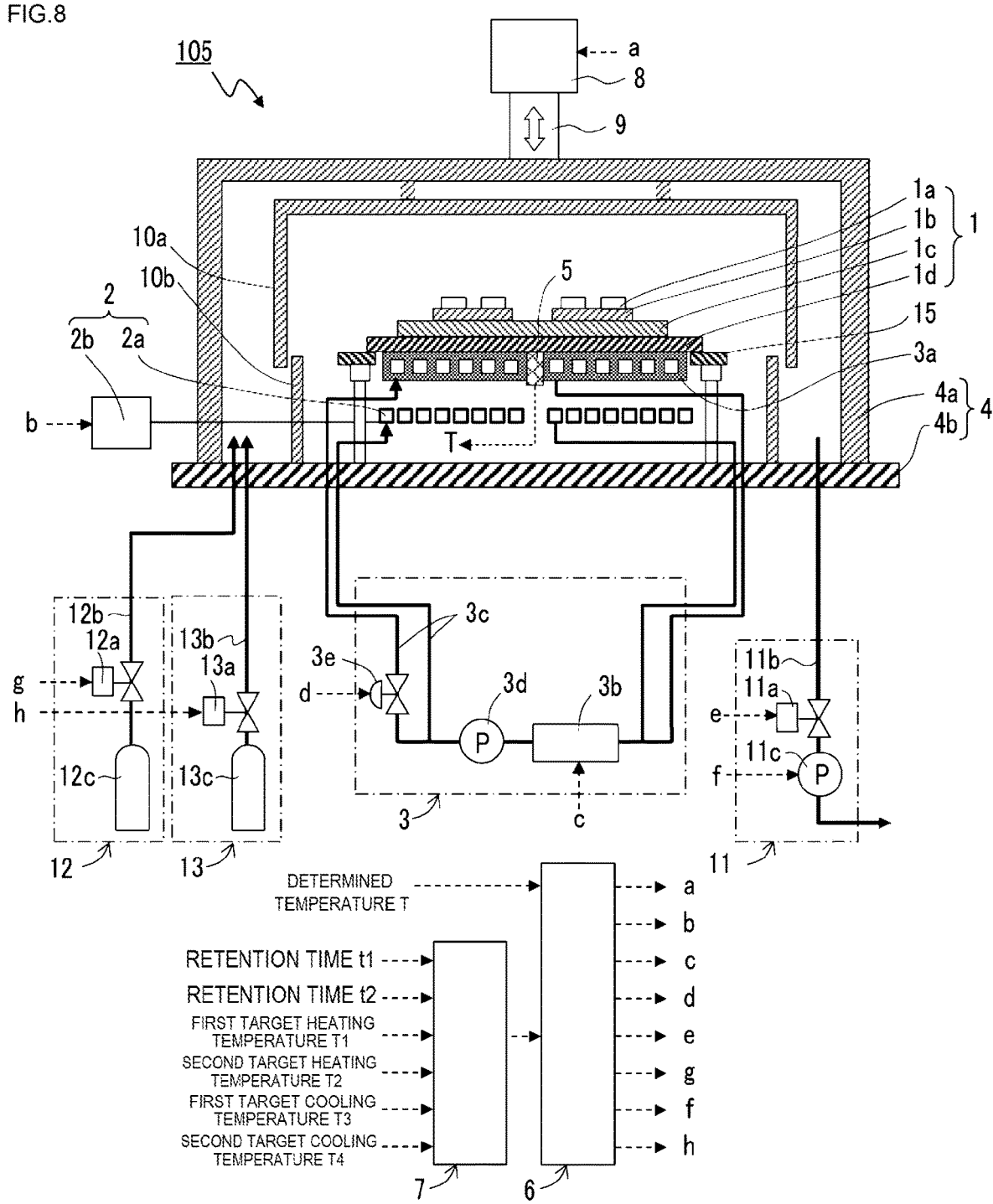
FIG. 8 illustrates still another diagrammatic sketch according to still another embodiment of the heating and cooling device of the present disclosure (including the induction heating coil is disposed in further non-contact manner in the vicinity of the bottom surface of the chamber).

FIG. 8 illustrates another aspect changed from the heating and cooling device 104 shown in FIG. 7.

A heating and cooling device 105 is configured so that the induction heating coil 2a, which is the non-contact type, is disposed toward a lower place than the cooling unit 3a of the cooling apparatus 3. Then the structure is configured so that the cooling unit 3a is disposed toward a lower place than the tray 1d on which the member-to-be-processed 1 is placed, and then the induction heating coil 2a disposed toward a further lower place than the cooling unit 3a. Other structures are similar to the embodiment.

According to this embodiment described above, even when the members-to-be-processed 1 having different heights are processed continuously, the distance remains unchanged between the member-to-be-processed 1 and the induction heating coil 2a because the induction heating coil 2a is disposed toward the lower place than the cooling unit 3a of the cooling apparatus 3. Then this can avoid adjusting again the height of the induction heating coil 2a, improving workability.

In addition, the induction heating coil 2a may be disposed toward an upper position than the member-to-be-processed 1 and also toward the lower place than the cooling unit 3a. Such a configuration obtains more excellent thermal uniformity as the member-to-be-processed 1 is heated from both the top and the bottom.

Figure 9A:
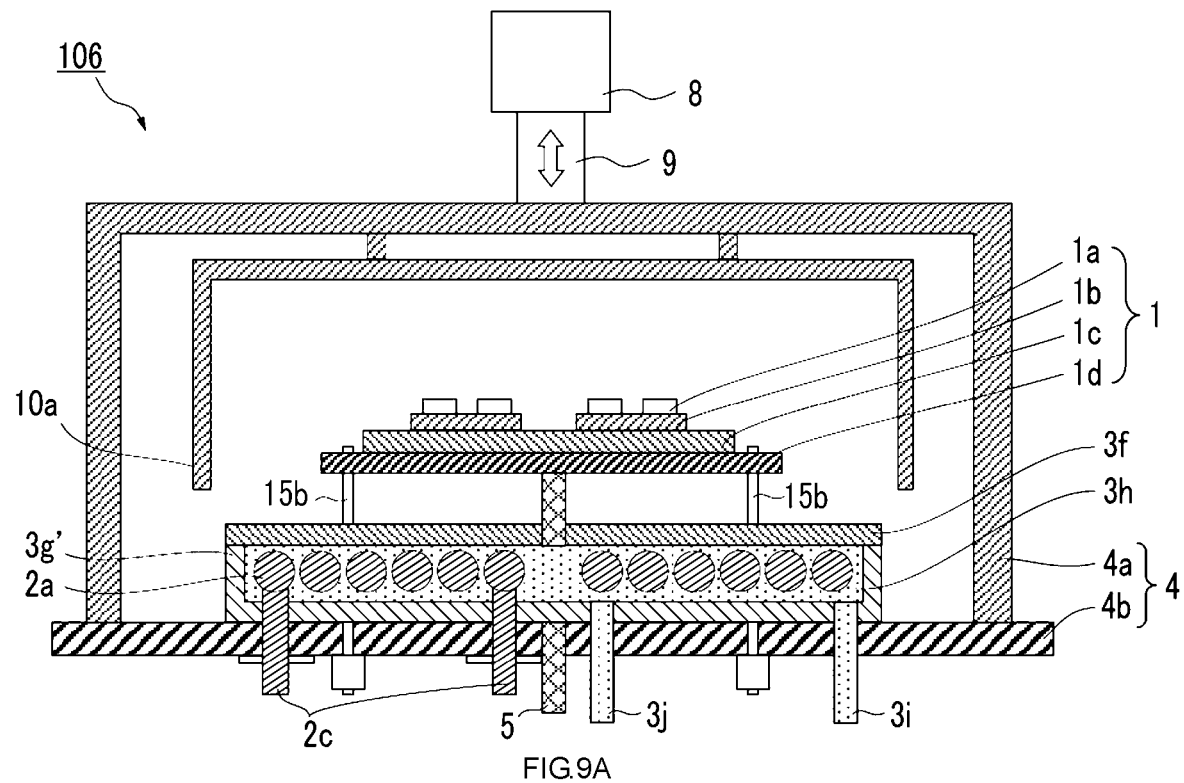
FIGS. 9A-B illustrate still further diagrammatic sketches according to still another embodiment of the heating and cooling device of the present disclosure (including the induction heating coil disposed in a coolant vessel).
Figure 9B:
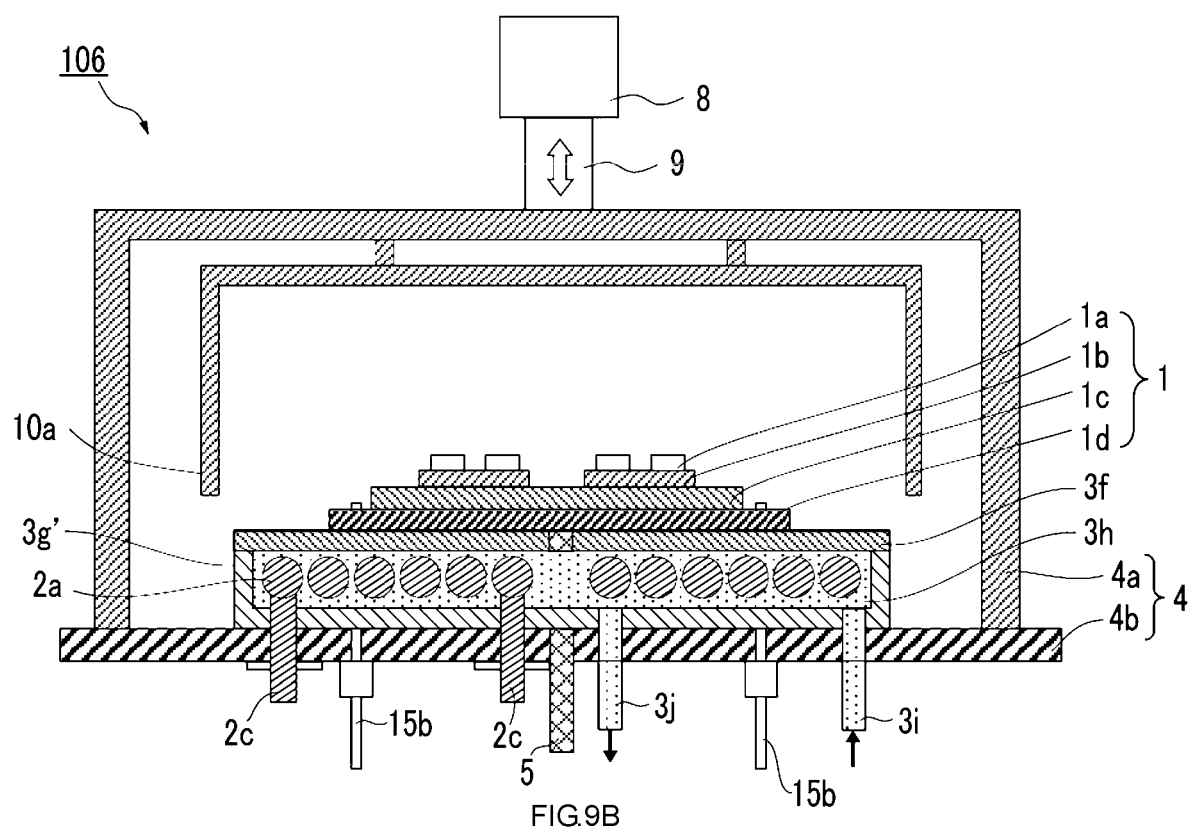

FIGS. 9A-B illustrate still another embodiment of the heating and cooling device according to the present disclosure.

A heating and cooling device 106 is configured so that the induction heating coil 2a is accommodated in a coolant vessel 3h of the cooling apparatus 3. Further as another flow path for circulating another coolant is formed in the coolant vessel 3h, the induction heating coil 2a is in a state of dipping in the coolant which circulates through the flow path.

The coolant vessel 3h is stored in a platform 3g' of which the upper part is open, and sealed with a cooling plate 3f. Moreover, a coolant inlet 3i and a coolant outlet 3j are provided to the bottom portion of the coolant vessel 3h. Then the coolant, which is, for example, cooling water, is introduced from the coolant inlet 3i and exhausted from the coolant outlet 3j. This provides cooling for the induction heating coil 2a and the cooling plate 3f abutting to the top surface of the cooling vessel 3h.

FIG. 9A shows a manner that the member-to-be-processed 1 is heated. When heating the member-to-be-processed 1, an alternating current is energized to a terminal 2c of the induction heating coil 2a. As a matter of fact, there are also other terminals 2c, not shown, in the induction heating coil 2a placed in the right side regarding the temperature sensor 5, and then the alternating current is energized from the other terminal 2c.

The tray 1d on which the member-to-be-processed 1 is placed is connected to the up-and-down shaft 15b of the transfer apparatus 15. During heating, the tray 1d is raised to a position being apart from the cooling plate 3f by at least equal to or more than 3 mm by using the transfer apparatus 15. However, the induction heating coil 2a can heat the member-to-be-processed 1 on a non-contact basis as the eddy current is generated to a conductive part of the member-to-be-processed 1.

Next, FIG. 9B illustrates a manner that the member-to-be-processed 1 is cooled. As shown in the figure, during cooling, the transfer apparatus 15 allows the tray 1d to descend, permitting the tray 1d to become in contact with the cooling plate 3f. This provides for cooling the member-to-be-processed 1 rapidly through the cooling plate 3f.

According to the present embodiment, the coolant circulating in the coolant vessel 3h is directly in contact with the cooling plate 3f, lightening loss in cooling capacity. Further restriction in shape is abbreviated with regard to the induction heating coil 2a. Then this ensures a sufficient number of windings and provides a way to use a low-loss Litz wire.

Figure 10A:
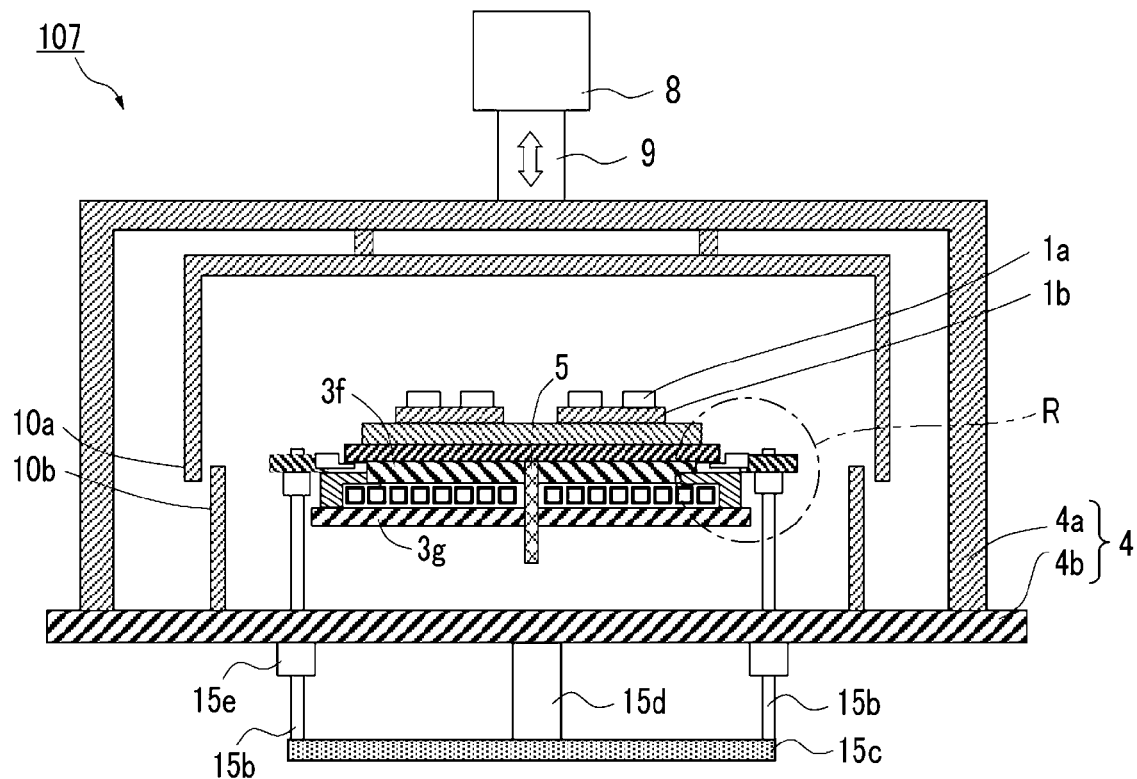
FIGS. 10A-B illustrate still further diagrammatic sketches according to still another embodiment of the heating and cooling device of the present disclosure (including an insulating cover for the induction heating coil).
Figure 10B:
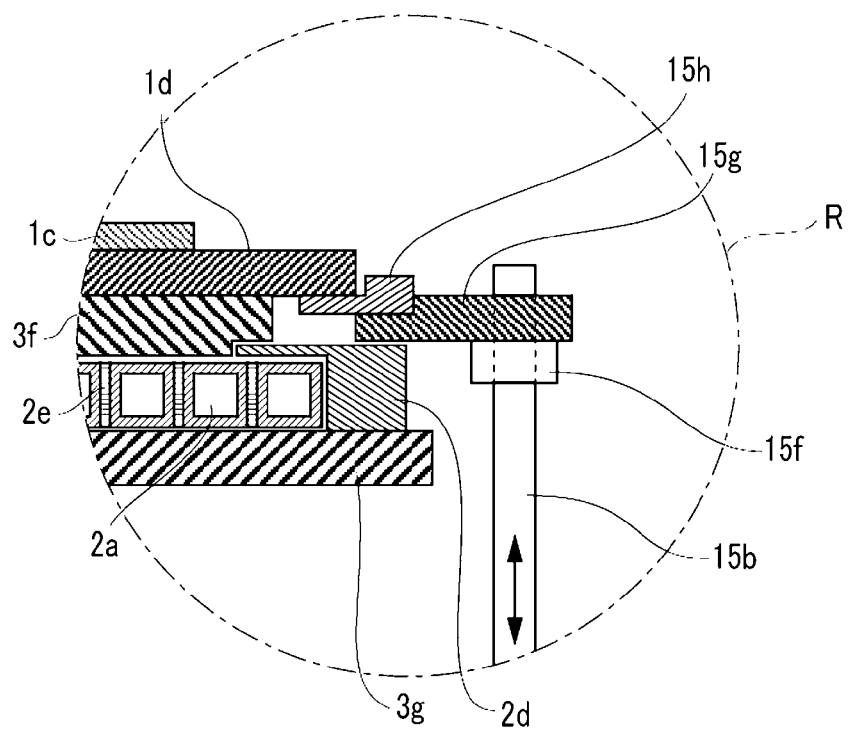

FIGS. 10A-B illustrate still another embodiment of the heating and cooling device according to the present disclosure.

First, a heating and cooling device 107 has a feature in the transfer apparatus 15 and particularly in a part where the tray 1d is placed. As shown in FIG. 10A, the up-and-down base 15c, which is formed to be flat-shaped, is connected to the up-and-down actuator 15d of the transfer apparatus 15. Further the up-and-down shaft 15b, which is fixed to the up-and-down base 15c and then inserted through the bottom 4b of the processing chamber 4, is installed so as to be moved up and down through up-and-down bearings 15e disposed in the bottom 4b.

FIG. 10B shows an enlarged view of the region designated with R in FIG. 10A. As shown in FIG. 10B, a pedestal 15f is provided to the other side of the up-and-down shaft 15b. Then a coupling plate 15g is provided so as to connect a pair of pedestals 15f corresponding to two up-and-down shafts 15b shown in FIG. 10A. Further a supporting unit 15h, which holds the edge of the bottom surface of the tray 1d on which the member-to-be-processed 1 is placed and is formed of heat-proof insulating materials such as, for example, engineering plastics including ceramics, polyimide, a PEEK plate, is fixed to the coupling plate 15g.

The supporting unit 15h is formed so that the member-to-be-processed 1 avoids interfering with the cooling plate 3f and an insulating cover 2d described later when the transfer apparatus 15 allows the member-to-be-processed 1 to descend. The transfer apparatus 15 having such a configuration allows the supporting unit 15h to be in motion smoothly while holding the tray 1d when the up-and-down actuator 15d moves up and down with an order of the control apparatus 6.

The heating and cooling device 107 has a further feature in the cooling apparatus 3. The cooling plate 3f, which is disposed to absorb heat from the member-to-be-processed 1 and the tray 1d those are heated up to a higher temperature through induction heating, is formed in close contact on the top surface side of the induction heating coil 2a having the hollow-structure so as to get better heat transfer. The cooling plate 3f, which is composed of ceramics with excellent thermal conductivity such as SiC, AlN and the like, is preferably formed so as to have a larger thickness than the member-to-be-processed 1 and then to increase heat capacity.

Further the supporting plate 3g, formed of insulating materials such as plastics, ceramics, and the like, is provided so as to fix the shape and the position of the induction heating coil 2a toward a lower side than the induction heating coil 2a.

At this point, the induction heating coil 2a requires a larger size than the cooling plate 3f in order to heat the member-to-be-processed 1 placed on the tray 1d having a rectangular shape so as to minimize unevenness in temperature. This results in exposing an upper surface of the induction heating coil 2a.

Then the upper surface of the induction heating coil 2a is covered with a heat proof insulating material such as, for example, poly(tetra-fluoro-ethylene) resin, polyimide, or machinable ceramics. Then the insulating cover 2d, which is formed so as to avoid interfering with the supporting unit 15h, is mounted to the supporting plate 3g.

At this moment, a notch is provided to the bottom side the cooling plate 3f so as to avoid creating a gap to the place between one edge of the cooling plate 3f and another edge of the insulating cover 2d, allowing the tip end of the insulating cover 2d to be inserted into the notch portion of the cooling plate 3f (see FIG. 10B).

When attaching and detaching the member-to-be-processed 1 and the tray 1d, providing the insulating cover 2d formed as described above can prevent conductive particles from accumulating on the induction heating coil 2a during operating for an extended period. This can obtain effects for avoiding a short circuit and discharge.

Furthermore a spacer 2e formed of the insulating material is inserted to the place between pipes forming the induction heating coil 2a, preventing the short circuit and discharge from occurring during being energized to to the induction heating coil 2a.

Figure 11:
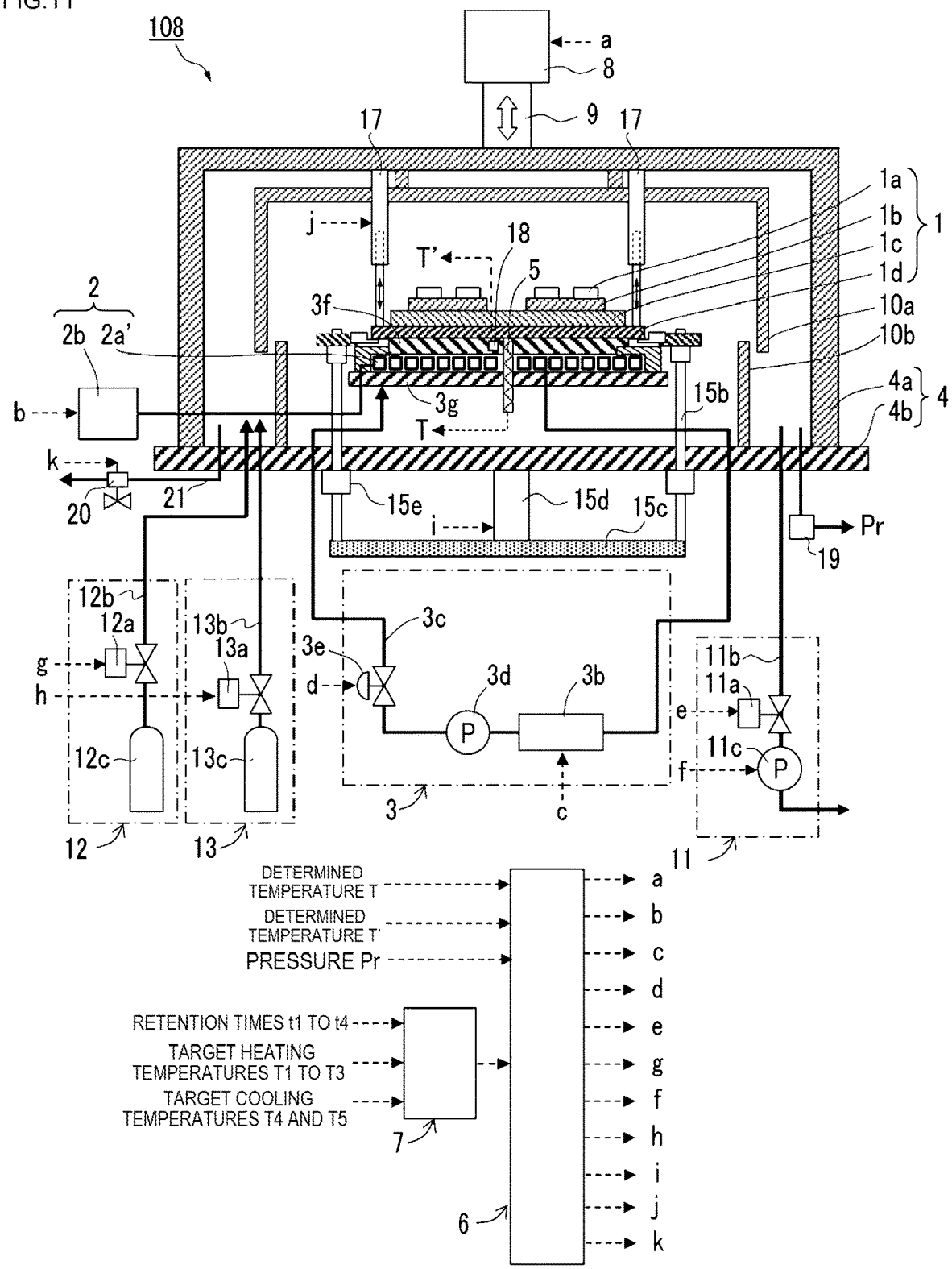
FIG. 11 illustrates still another diagrammatic sketch according to still another embodiment of the heating and cooling device of the present disclosure (including a tray pressing system and a pressure gauge).

FIG. 11 illustrates still another embodiment of the heating and cooling device according to the present disclosure.

A heating and cooling device 108 is configured to heat the member-to-be-processed 1 placed on the tray 1d with induction heating coil 2a when the transfer apparatus 15 allows the tray 1d to ascend during heating. Further during cooling, the transfer apparatus 15 allows the tray 1d to descend, permitting the tray 1d to become in contact with the cooling plate 3f. On account of this, heat of the tray 1d is conducted to the cooling plate 3f, resulting in dissipation. This provides cooling for the member-to-be-processed 1.

During cooling, the tray 1d may warp owing to thermal deformation of the tray 1d or bend down owing to weight of the member-to-be-processed 1. In this case, the area where the tray 1d is in contact with the cooling plate 3f might decrease, causing to obtain only insufficient cooling performance. If sufficient cooling performance is not achieved, solder components become coarse to develop cracks readily when creep deformation occurs. This results in reliability deterioration over an extended period with regard to solder joint strength.

Hence, a heating and cooling device 108 is configured so that a tray pressing system 17 applies pressure to the periphery of the tray 1d, pressing the tray 1d to the cooling plate 3f. This allows the contact between the tray 1d and the cooling plate 3f to be in an excellent condition at all times.

However, the tray 1d is often formed of the carbon material and then not sufficiently robust in strength. This may become vulnerable to breakage. Namely, when tray 1d is aggressively pressed to the cooling plate 3f through the tray pressing system 17, the tray 1d is worn-out or finally becomes broken.

For this reason, the cooling status can be determined while observing the temperature of the tray 1d with the temperature sensor 5, and further while observing the temperature of the cooling plate 3f with a cooling plate temperature sensor 18 in order to improve the contact area between the tray 1d on which the member-to-be-processed 1 is placed and the cooling plate 3f when pressing the tray 1d to the cooling plate 3f.

The control apparatus 6 of the heating and cooling device 108 determines whether a contact condition between the tray 1d and the cooling plate 3f is excellent or not in real time with the method described above and then controls the tray pressing system 17 so as to press the tray 1d only when the contact condition is poor by using a signal line j. This prevents the tray pressing system 17 from pressing the tray 1d more than necessary. Thus this can lead to reduction of the breakage.

As described above, the heating and cooling device 108 can improve the contact condition between the tray 1d and the cooling plate 3f and then maintain a predetermined cooling characteristics. Namely, the member-to-be-processed 1 can be cooled swiftly, preventing the solder components from becoming coarse. This leads to excellent solder joint condition.

Finally, output control will be described as one more feature of the heating and cooling device 108. The heating and cooling device 108 has a circuit configuration almost similar to the heating and cooling device 100 described in FIG. 1. However, there are differences in that a pressure gauge 19 is provided for determining the pressure in the processing chamber 4, and a release valve 20 and release piping 21 provided so as to release the pressure in the processing chamber 4.

When the pressure in airtight processing chamber 4 is more than a constant pressure, which indicates, for example, above the atmospheric pressure, the control apparatus 6 can control the release valve 20 connected to the release piping 21 and release the pressure. The control apparatus 6 is configured so as to operate open/close motion of the release valve 20 through a signal line k and to control the pressure in the processing chamber 4.

Moreover, when another signal is transmitted from the pressure gauge 19 to the control apparatus 6, the control apparatus 6 is configured so as to control open/close motion of the valve 11a and operation of the vacuum pump 11c.

The control apparatus 6 can control the temperature of the member-to-be-processed 1 by using parameters such as the wave number and the live current being supplied to the induction heating coil 2a, the flow rate and the temperature of the coolant provided to the induction heating coil 2a having the hollow-structure at the inlet, a pressure Pr in the processing chamber 4, and the distance between the member-to-be-processed 1 and the cooling unit 3a.

Hereinafter, a method for soldering a power semiconductor device will be described by using the heating and cooling device 108 mainly about points different from that by using the heating and cooling device 100 described earlier.

(1) Bringing In

The open/close apparatus 8 allows the lid unit 4a of the processing chamber 4 to ascend to open the processing chamber 4, and then the member-to-be-processed 1 is brought in. The member-to-be-processed 1 is placed on the frame 15a, and then the open/close apparatus 8 allows the lid unit 4a of the processing chamber 4 to descend, closing the processing chamber 4. This makes an enclosed space.

(2) Evacuating

The valve 11a of the evacuation apparatus 11 is opened, and then the inside of the processing chamber 4 is evacuated by using the vacuum pump 11c. Then the valve 11a is closed when a reading of the pressure gauge 19 approaches to a predetermined vacuum level.

(3) Introducing Reducing Gas

The reducing gas is introduced from the reducing gas cylinder 12c to the processing chamber 4 while opening the valve 12a of the reducing gas supply apparatus 12. When an internal pressure of the processing chamber 4 approaches to the atmosphere, the release valve 20 is opened, and then a supply flow rate of the reducing gas is adjusted with the valve 12a.

In the case of performing the reduction reaction in a state where the processing chamber 4 is depressurized, the valve 12a is closed to seal the processing chamber 4 when another reading of the pressure gauge 19 determining the processing chamber 4 in pressure reaches to a predetermined pressure. This leads to keeping the pressure with airtightness.

(4) First Heating (Reduction Process)

When using the induction heating apparatus 2, the member-to-be-processed 1 is heated to the first target heating temperature T1, and a temperature T of the member-to-be-processed 1 determined by the temperature sensor 5 is kept to be the first target heating temperature T1 during the retention time t1, so that the member-to-be-processed 1 is heated preliminarily, and the surface of the member-to-be-processed 1 is performed with reduction reaction to increase wettability for soldering. The member-to-be-processed 1 is held in a state where a gap is made by using the transfer apparatus 15 so as to avoid being in contact with the cooling unit 3a during heating. Consequently, heat hardly escapes from the member-to-be-processed 1 to the cooling unit 3a. Then the member-to-be-processed 1 can be heated swiftly. The control apparatus 6 can perform feedback-control with respect to the output of the induction heating apparatus 2 so that the deviation from the first target heating temperature T1 is minimized regarding the temperature T determined by the temperature sensor 5.

The member-to-be-processed 1 is kept to have the first target heating temperature T1, and then the valve 12a of the reducing gas supply apparatus 12 and the release valve 20 are closed after a lapse of the retention time t1. Further the valve 11a of the evacuation apparatus 11 is opened to start operation of the vacuum pump 11c. Then the processing chamber 4 is evacuated until the pressure thereof reaches to Pr1, and then the valve 11a is closed.

At this time, the control apparatus 6 receives input data including still another reading of the pressure gauge 19 installed to the processing chamber 4 and the distance between the cooling plate 3f and the tray 1d on which the member-to-be-processed 1 is placed. Then the control apparatus 6 makes a conversion from the input data every time and outputs the maximum live current or electric power capable of being supplied to the induction heating coil 2a without creating a discharge, controlling heating until arrival to the second target heating temperature T2.

At this point, it is known that discharge generated from the induction heating coil 2a varies with electric power energized to the induction heating coil and the product of pressure and distance in the processing chamber 4 (Paschen's law). In other word, the maximum live current or electric power is adjusted so that the condition is set to be lower than that of the curve designated from Paschen's law.

The second target heating temperature T2 is set to be slightly higher than the liquidus temperature TS of solder material employed in the member-to-be-processed 1. There is an effect preventing the reducing gas in the processing chamber 4 from being involved in solder when the solder material is molten under diminished pressure environment.

(5) Second Heating (Solder Melting)

When using the induction heating apparatus 2, the member-to-be-processed 1 is heated to the third target heating temperature T3. Then another temperature T of the tray 1d, on which the member-to-be-processed 1 is placed, determined by the temperature sensor 5 is kept to be the third target heating temperature T3 during a retention time t3, melting the solder placed on the member-to-be-processed 1. The third target heating temperature T3 is set so as to be sufficiently higher than the solder liquidus temperature TS, allowing alloy layers to grow readily to solder joint surfaces with respect to molten solder material, the base plate 1c and the insulating substrate 1b of the member-to-be-processed 1, and further solder joint surfaces between the insulating substrate 1b and the semiconductor element 1a thereof.

The control apparatus 6 can control the wave number and the live current being supplied to the induction heating coil 2a of the induction heating apparatus 2, the flow rate and the temperature of the cooling and circulating apparatus circulating the coolant, and the distance between the tray 1d on which the member-to-be-processed 1 is placed and the cooling plate 3f so that the deviation from the third target heating temperature T3 is minimized regarding the temperature T determined by the temperature sensor 5.

When the solder melting process has been completed under diminished pressure as described above, the valve 12a of the reducing gas supply apparatus 12 is opened to control the processing chamber 4 in pressure so as to reach the atmospheric pressure. When having reached the atmospheric pressure, the degree of opening is adjusted for the valve 12a of the reducing gas supply apparatus 12, keeping the reducing gas flowing in the processing chamber 4. Then the release valve 20 is opened so as to avoid being pressurized in the processing chamber 4.

However, when the processing chamber 4 is set to be Pr2, which indicates to be under diminished pressure, the control apparatus 6 is configured so as to make a conversion every time in response to the pressure in the processing chamber 4 and the distance between the cooling plate 3f and the tray 1d on which the member-to-be-processed 1 is placed with regard to the heating until the third target heating temperature T3 of the member-to-be-processed 1 and output the maximum live current or electric power provided to the induction heating coil 2a of the induction heating apparatus 2, controlling the temperature T of the member-to-be-processed 1 and the tray 1d.

When the member-to-be-processed 1 and the tray 1d reaches the third target heating temperature T3, and then the predetermined retention time t3 has passed, the valve 12a of the reducing gas supply apparatus 12 and the release valve 20 are closed. Then the vacuum pump 11c of the evacuation apparatus 11 is driven, and the valve 11a thereof opened. The reducing gas in the processing chamber 4 is exhausted until reaching another predetermined pressure.

When the inside of the processing chamber 4 has reached the predetermined pressure, the valve 11a is closed, and then the valve 12a of the reducing gas supply apparatus 12 is opened. This recovers the processing chamber 4 to the atmospheric pressure. Then when reaching the atmospheric pressure, the release valve 20 is opened again. This operation can exhaust gases involved in solder of the member-to-be-processed 1, decreasing voids created in solder joint portion.

In addition, the control apparatus 6 controls the wave number and the live current or electric power supplied to the induction heating coil 2a of the induction heating apparatus 2 until the member-to-be-processed 1 reaches the third target heating temperature T3 during a predetermined retention time t4. This process allows the solder joint face of the member-to-be-processed 1 to maintain the alloy layer with a predetermined thickness.

(6) Cooling (Solder Solidification)

After stopping heating through the induction heating apparatus 2, the member-to-be-processed 1 becomes to be in contact with or comes close to the cooling plate 3f by using the transfer apparatus 15, being cooled with the cooling plate 3f. Further the control apparatus 6 can perform feedback-controlling with respect to the cooling apparatus so that the deviation from the first target cooling temperature T4 is minimized regarding the temperature T determined by the temperature sensor 5. The cooling plate 3f is formed of material that is not heated directly and then does not make a raise in temperature. This provides cooling for the member-to-be-processed 1 swiftly, resulting in shortening the time for cooling to increase the throughput of the heating and cooling device.

(7) Introducing Inert Gas

When the temperature T of the member-to-be-processed 1, which is determined by the temperature sensor 5, reaches a second target cooling temperature T5, the valve 11a of the evacuation apparatus 11 is opened in a state where the valve 12a of the reducing gas supply apparatus 12 is closed, and then the inside of the processing chamber 4 is evacuated by using the vacuum pump 11c. When still another reading of the pressure gauge 19 of the processing chamber 4 reaches a predetermined vacuum level, the inert gas is supplied from an inert gas cylinder 13c to the processing chamber 4 while the valve 11a is closed and then the valve 13a of the inert gas supply apparatus 13 is opened. When returning to the atmospheric pressure in the processing chamber 4, the release valve 20 is opened, and the reducing gas is released to the release piping 21. Then after a lapse of a predetermined time, the valve 13a and the release valve 20 are closed. During the period also described above, the member-to-be-processed 1, which is placed on the cooling plate 3f, is being cooled continuously.

(8) Carrying Out

When the processing chamber 4 is pulled open so that the lid unit 4a of the processing chamber 4 is raised with the open/close apparatus 8, the member-to-be-processed 1 is carried out. Then the open/close apparatus 8 allows the lid unit 4a of the processing chamber 4 to descend, closing the processing chamber 4.

As described above, in the heating and cooling device according to the present disclosure, the cooling plate 3f of the cooling apparatus 3 is disposed toward the lower place than the member-to-be-processed 1 so as to abut onto the induction heating coil 2a in which the coolant is circulated. Namely, only up and down motions in one processing chamber 4 allows the apparatus to perform the reduction process for improving solder wettability, the solder melting process, and the solder solidification process. Then it is miniaturized in comparison with a conventional soldering apparatus.

According to this embodiment described above, even though members-to-be-processed 1 having different heights with each other are processed continuously, the distance between the member-to-be-processed 1 and the induction heating coil 2a remains unchanged as the induction heating coil 2a is disposed toward the lower place than the cooling plate 3f. Then it becomes unnecessary to adjust the height of the induction heating coil 2a again. This can improve workability.

Furthermore as the induction heating coil 2a advantageously acts to heat only the semiconductor module of the member-to-be-processed 1 with ease and to heat hardly the inner wall of the processing chamber 4 and the cooling unit 3a, this can eliminate waste for heating, performing both heating and cooling of the semiconductor module sharply.

The foregoing shows only one of embodiments according to the present disclosure, and then other embodiments modified can be considered variously. For example, the heating and cooling device may be configured in combination with respective components corresponding to application purposes such that, for example, the tray pressing system 17 is applied to the heating and cooling device 106 having the cooling vessel 3h.

Fluid such as water, pure water, anti-freeze fluid or the like capable of cooling in the heat exchanger 3b can be employed, and then they are available to every configuration of the heating and cooling device. Furthermore, a sealing member such as O-ring may be provided to the contact surface between the lid unit 4a and the bottom unit 4b of the processing chamber 4. When the open/close apparatus 8 allows the lid unit 4a to descend to the bottom unit 4b, deformation of the elastic sealing member permits the processing chamber 4 to remain with airtightness.

Inclusion in this disclosure of any characterization of any product or method of the related art does not imply or admit that such characterization was known in the prior art or that such characterization would have been appreciated by one of ordinary skill in the art at the time a claimed was made, even if the product or method itself was known in the prior art at the time of invention of the present disclosure. For example, if a related art document discussed in the foregoing sections of this disclosure constitutes prior art, the inclusion of any characterization of the related art document does not imply or admit that such characterization of the related art document was known in the prior art or would have been appreciated by one of ordinary skill in the art at the time a claimed was made, especially if the characterization is not disclosed in the related art document itself.

The phrase "at least one of," when followed by a list of two or more items, is an alternative expression denoting a selection of one or a combination of items from the list.

While the present invention has been particularly shown and described with reference to embodiment thereof, such as those discussed above, it will be understood by those skilled in the art that the foregoing and other changes in form and details can be made therein without departing from the spirit and scope of the present invention.

Reference Signs and Numerals are as Follows 1 member-to-be-processed
1a semiconductor element
1b insulating substrate
1c base plate
1d tray
2 induction heating apparatus
2a heating unit (induction heating coil)
2aa flat-shaped induction heating coil in which outside-shape of principal surface is circular (circular coil)

2*ab* flat-shaped induction heating coil in which outside-shape of principal surface is vertically-oriented-elliptical coil (vertically-oriented-elliptical coil)
2*ac* induction heating coil in which outside-shape of principal surface is gourd-shaped (gourd-shaped coil)
2*b* power supply
2*c* terminal
2*d* insulating cover
2*e* spacer
3 cooling apparatus
3*a* cooling unit
3*b* heat exchanger
3*c* coolant piping
3*d* circulating pump
3*e* flow rate regulating valve
3*f* cooling plate
3*g* supporting plate
3*g'* platform
3*h* coolant vessel
3*i* coolant inlet
3*j* coolant outlet
4 processing chamber
4*a* lid unit
4*b* bottom unit
5 temperature sensor
6 control apparatus
7 inputting apparatus
8 open/close apparatus
9 shaft
10*a*, 10*b* heat-shielding cover
11 evacuation apparatus
11*a* valve
11*b* piping
11*c* vacuum pump
12 reducing gas supply apparatus
12*a* valve
12*b* piping
12*c* reducing gas cylinder
13 inert gas supply apparatus
13*a* valve
13*b* piping
13*c* inert gas cylinder
15 transfer apparatus
15*a* frame
15*b* up-and-down shaft
15*c* up-and-down base
15*d* up-and-down actuator
15*e* up-and-down bearings
15*f* pedestal
15*g* coupling plate
15*h* supporting unit
16 soft magnetic component
17 tray pressing system
100-108 heating and cooling device
A, B temperature reference position
Pr pressure
S constriction positioned around center of gourd-shaped coil in longitudinal direction
T, T' temperature
L1 distance from end part of gourd-shaped coil in longitudinal direction to outside edge of tray
L2 distance from most jutting outside edge of gourd-shaped coil to outside edge of member-to-be-processed on side having constriction S of gourd-shaped coil
L3 distance between induction heating coils disposed in parallel
L4 distance between induction heating coil and tray
LT low temperature portion
HT high temperature portion

What is claimed is:

1. A heating and cooling device comprising:
   an airtight processing chamber openable to load a member-to-be-processed in the airtight processing chamber;
   a transfer apparatus to adjust a distance between the member-to-be-processed and a cooling unit that cools the member-to-be-processed, by moving the member-to-be-processed and/or the cooling unit;
   an induction heating apparatus to heat the member-to-be-processed, including an induction heating coil;
   a cooling apparatus to cool the member-to-be-processed by cooling the cooling unit;
   a temperature sensor, electromagnetically shielded from the induction heating coil, to determine a temperature of the member-to-be-processed; and
   a controller
      to control a heating operation of the induction heating apparatus by controlling at least one of a wave number and a live current provided to the induction heating coil, based on the temperature determined by the temperature sensor, and
      to control the cooling apparatus, based on the temperature determined by the temperature sensor.

2. The heating and cooling device according to claim 1, wherein
   the induction heating coil is disposed below the member-to-be-processed.

3. The heating and cooling device according to claim 2, wherein
   the induction heating coil has a hollow structure, and
   the cooling apparatus is configured to circulate a coolant through the hollow structure of the induction heating coil.

4. The heating and cooling device according to claim 3, wherein
   the cooling unit includes a cooling plate abutting onto the upper surface of the induction heating coil, such that the coolant cools the cooling unit when the coolant passes through the hollow structure of the induction heating coil.

5. The heating and cooling device according to claim 2, wherein
   the cooling unit includes a cooling plate positioned between the member-to-be-processed and the induction heating coil,
   the heating and cooling device further comprises a coolant vessel below the cooling plate and in which the induction heating coil is disposed, and
   the cooling apparatus is configured to circulate a coolant through the coolant vessel, such that the coolant flows around the induction heating coil.

6. The heating and cooling device according to claim 4, wherein the cooling plate is formed of a ceramic.

7. The heating and cooling device according to claim 6, wherein the ceramic is silicon carbide, silicon nitride, or aluminum nitride.

8. The heating and cooling device according to claim 5, wherein the cooling plate is formed of a ceramic.

9. The heating and cooling device according to claim 8, wherein the ceramic is silicon carbide, silicon nitride, or aluminum nitride.

10. The heating and cooling device according to claim 1, further comprising:
an insulating cover formed of a heatproof insulation material and covering a surface of the induction heating coil.

11. The heating and cooling device according to claim 1, wherein the cooling unit is disposed below the member-to-be-processed, and the induction heating coil is disposed above the member-to-be-processed.

12. The heating and cooling device according to claim 1, wherein the cooling unit is disposed below the member-to-be-processed and the induction heating coil is disposed below the cooling unit.

13. The heating and cooling device according to claim 4, wherein
based on the temperature determined by the temperature sensor,
the controller controls a cooling operation of the cooling apparatus by controlling at least one of a coolant flow rate, a temperature at an inlet of the coolant circulated by the cooling apparatus, and a distance between the member-to-be-processed and the cooling plate.

14. The heating and cooling device according to claim 5, wherein
based on the temperature determined by the temperature sensor,
the controller controls a cooling operation of the cooling apparatus by controlling at least one of a coolant flow rate, a temperature of the coolant provided to the cooling apparatus at another inlet, and a distance between the member-to-be-processed and the cooling plate.

15. The heating and cooling device according to claim 1, further comprising:
an evacuation apparatus connected to the airtight processing chamber;
a reducing gas supply apparatus to introduce reducing gas into the processing chamber; and
an inert gas supply apparatus to introduce an inert gas into the processing chamber;
wherein the controller is further configured to control the evacuation apparatus, the reducing gas supply apparatus, and the inert gas supply apparatus.

16. The heating and cooling device according to claim 15, further comprising:
a pressure gauge to measure an internal pressure of the processing chamber,
wherein the controller:
controls the evacuation apparatus to diminish the internal pressure of the processing chamber,
obtains the internal pressure of the processing chamber from the pressure gauge, and
determines a maximum live current to provide to the induction heating coil, based on measurements of the diminished internal pressure obtained by the pressure gauge and the at least one of the wave number and the live current provided to the induction heating coil.

17. The heating and cooling device according to claim 1, wherein
the induction heating coil has an elliptical shape elongated in a longitudinal direction, with a constriction positioned around a center of the induction heating coil in the longitudinal direction, and
the induction heating coil is disposed in parallel with the member-to-be-processed.

18. The heating and cooling device according to claim 1, further comprising:
a second induction heating apparatus disposed within the processing chamber; and
a second cooling apparatus disposed within the processing chamber.

19. The heating and cooling device according to claim 1, further comprising:
a tray supporting the member-to-be-processed and disposed above the cooling unit such that the tray is cooled when the tray is in contact with the cooling unit; and
a pressing unit to press the tray to the cooling unit.

20. The heating and cooling device according to claim 1, wherein
the transfer apparatus is configured to adjust the distance between the member-to-be-processed and the cooling unit by moving the cooling unit while the member-to-be-processed remains at a constant position within the airtight processing chamber.

* * * * *